(12) United States Patent
Uno et al.

(10) Patent No.: US 7,535,812 B2
(45) Date of Patent: May 19, 2009

(54) SIGNAL PROCESSING METHOD, SIGNAL PROCESSING CIRCUIT AND INFORMATION RECORDING/REGENERATING APPARATUS

(75) Inventors: Hiroshi Uno, Kawasaki (JP); Kiichiro Kasai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/075,376

(22) Filed: Mar. 11, 2008

(65) Prior Publication Data

US 2008/0158706 A1    Jul. 3, 2008

Related U.S. Application Data

(63) Continuation of application No. 10/763,058, filed on Jan. 22, 2004, which is a continuation of application No. PCT/JP01/06506, filed on Jul. 27, 2001.

(51) Int. Cl.
*G11B 20/10* (2006.01)
(52) U.S. Cl. .................. 369/59.22; 369/59.23
(58) Field of Classification Search ........... None
See application file for complete search history.

(56) References Cited

U.S. PATENT DOCUMENTS

| 5,563,864 | A |   | 10/1996 | Kobayashi et al. |
| 5,799,046 | A |   | 8/1998 | Hayashi |
| 5,961,658 | A |   | 10/1999 | Reed et al. |
| 5,995,545 | A |   | 11/1999 | Ueno |
| 6,046,874 | A | * | 4/2000 | Takahashi ............ 360/65 |
| 6,335,841 | B1 | * | 1/2002 | Hirano et al. ............ 360/40 |
| 6,373,407 | B1 | * | 4/2002 | Nishiya et al. ............ 341/59 |
| 6,546,518 | B1 | * | 4/2003 | Leung et al. ............ 714/769 |
| 6,625,235 | B1 |   | 9/2003 | Coker et al. |
| 6,633,444 | B2 |   | 10/2003 | Uno et al. |
| 6,691,263 | B2 |   | 2/2004 | Vasic et al. |
| 6,735,724 | B1 | * | 5/2004 | McClellan ............ 714/704 |
| 6,751,276 | B1 | * | 6/2004 | Okada et al. ............ 375/350 |
| 6,850,573 | B1 |   | 2/2005 | Noda |
| 2001/0036236 | A1 |   | 11/2001 | Kobayashi et al. |

FOREIGN PATENT DOCUMENTS

| JP |   | 7-107124 | 4/1995 |
| JP |   | 2000-156042 | 6/2000 |

OTHER PUBLICATIONS

Engish translation of—Triceps Kikakubu Edition; "PRML Shori Shingou Gijutsu"; Kabushiki Kaisha Triceps; Sep. 2, 1996; pp. 94-114).*
Triceps Kikakubu Edition; "PRML Shingou Shori Gijutsu"; Kabushiki Kaisha Triceps; Sep. 2, 1996; pp. 94-114.
Nikkei Electronics Edition; "Data Asshuku to Digital Henchou"; 1998 edition; Digital Henchou Edition; Nikkei BP K.K.; Nov. 1, 1997; pp. 175-176.

* cited by examiner

*Primary Examiner*—Paul Huber
(74) *Attorney, Agent, or Firm*—Greer, Burns & Crain, Ltd

(57) ABSTRACT

A partial response is utilized to record information on a medium and then regenerate the information from the medium. A regenerating system undergoes equalization including subjecting a regeneration signal from the medium to the convolution of $$(k-s \cdot D)$$

(where D is one (1) bit delay operator, and
k and s are positive integer).

Such convolution is performed in the regenerating system so that low-frequency band noises are reduced with an improved error rate. The information is decoded from the equalized signal by use of maximum-likelihood detection.

3 Claims, 29 Drawing Sheets

FIG. 36A DATA 01010111 00110110 01011001 00011110 001

FIG. 36B INPUT CODE 01101101110001101100101101100011100001110001

FIG. 36C NRZI $\begin{bmatrix} 1/(1-D) \\ (1-D) \end{bmatrix}$ RECORDING CURRENT 010-110-11-1001-110-1100-101-1100-1-1000-1

FIG. 36D DIFFERENTIAL DETECTION

FIG. 36E HEAD OUTPUT

FIG. 36F EQUALIZER

FIG. 36G MAXIMUM-LIKELIHOOD DETECTION

FIG. 36H OUTPUT CODE 01101101000101101101001011011000011100001

FIG. 36I DATA 01010111 00110110 01011001 00011110 001

SIGNAL PROCESSING METHOD, SIGNAL PROCESSING CIRCUIT AND INFORMATION RECORDING/REGENERATING APPARATUS

This application is a continuation of U.S. patent application Ser. No. 10/763,058, filed Jan. 22, 2004, which is a continuation of International PCT Application No. PCT/JP01/06506 filed Jul. 27, 2001.

TECHNICAL FIELD

The present invention relates generally to a signal processing method, signal processing circuit and information recording/regenerating apparatus utilizing a partial response, and more particularly, to a signal processing method, signal processing circuit and information recording/regenerating apparatus best suited to perform high density recording with reduced medium noises.

BACKGROUND ART

Recently, recording density of magnet disk units is dramatically increasing. This is largely attributable to a highly-sensitive MR head (Magneto-Resistive effect head). Simultaneously, this is also largely attributable to practical use of PR4ML (Partial Response class 4 Maximum-Likelihood) method which can perform regeneration with low S/N ratio as signal processing method, rather than conventional peak detection method. The PR4ML method removes waveform intervention by utilizing partial response, reduces noises by lowering a frequency band, and performs convolution according to $$U(T) = (1-D) \cdot (1+D)^n$$

D: delay operator indicating one (1) bit delay, and then, finds a signal with maximum-likelihood from regeneration signals containing disturbances such as noises by a maximum-likelihood detecting circuit with Viterbi algorithm. At this point, the convolution of (1+D) has the transfer constant shown in FIG. 1, and is improved to increase the order n to 2 or 3, in order to reduce noises of high-frequency band. As a result, though the maximum-likelihood detecting circuit becomes more complicated, error rate is improved. The order n is limited up to 3, and in case that it was increased to more than 3, improvement of the error rate was little. In the noises regenerated in magnetic recording, the large power noises are contained in a low-frequency band, rather than a high-frequency band. Most of the noises in the high-frequency band are distributed substantially uniformly throughout the bandwidth of noises such as pre-amplifier noises and MR head noises. Contrary, a peak of power of medium noises is present relatively near the low-frequency band, partially depending on materials of recording medium. Recently, since an area of one (1) bit is closing in on that of particles of magnetic materials, the medium noises are increasing, therefore some recording medium have the marked peak of power in low-frequency band, as showing in FIG. 2. Also, side-crosstalk from adjacent tracks becomes larger in lower frequency band, because of the nature thereof. Conventionally, it is believed that the convolution of (1+D) is enough for the noises in low-frequency band. In this point, it is believed that the convolution of (1+D) has transfer characteristic showing in FIG. 3, and reduces the noises in low-frequency band. However, since this convolution in magnetic recording is actually performed in a recording system before generation of the medium noises, and an equalizing target thereof is characteristic showing in FIG. 4, therefore the convolution of (1+D) does not act on the noises in low-frequency band at all, and medium noises is not affected by the transfer characteristic with the convolution of (1+D).

DISCLOSURE OF THE INVENTION

According to the present invention, there are provided a signal processing method, signal processing circuit and information recording/regenerating apparatus utilizing partial response to reduce the noises in low-frequency band and improve recording density.

According to the present invention, there are also provided a signal processing method, signal processing circuit and information recording/regenerating apparatus utilizing partial response to reduce the medium noises and improve the regeneration error rate.

According to the present invention, there are provided a signal processing method, signal processing circuit and information recording/regenerating apparatus utilizing partial response to reduce side-crosstalk and improve the regeneration error rate.

The present invention provides a signal processing method utilizing a partial response to record information on a medium and then regenerate the information from the medium, wherein a regeneration signal from the medium is subjected to an equalizing process including the convolution of $$(k - s \cdot D)$$

where D: one (1) bit delay operator, and k, s: positive integer, k≠s.

In the present invention, the information is decoded from the signal equalized through the convolution of (k−s·D), by use of maximum-likelihood detection. In this manner, by performing a convolution of (k−s·D) in a regenerating system, the present invention can reduce low-frequency band noises and improve the error rate. Also, by making the convolution as (k−s·D) and optimizing k and s, it is possible to obtain optimum filter characteristics suitable for characteristics of the medium noises and improve the error rate.

The present invention provides a signal processing circuit utilizing a partial response to record information on a medium through a recording system and regenerate the information from the medium through a regenerating system, wherein the regenerating system includes an equalizer subjecting a regeneration signal from the medium to the convolution of $$(k - s \cdot D)$$

where D: one (1) bit delay operator, and k, s: positive integer, k≠s.

The signal processing circuit comprises a maximum-likelihood detector which decodes the information from an output signal of the equalizer by use of maximum-likelihood detection.

The present invention provides a signal recording/regenerating apparatus utilizing a partial response to record information on a medium through a recording system and regenerate the information from the medium through a regenerating system, wherein the regenerating system includes an equalizer subjecting a regeneration signal from the medium to the convolution of $$(k - s \cdot D)$$

where D: one (1) bit delay operator, and k, s: positive integer, k≠s.

The signal recording/regenerating apparatus comprises a maximum-likelihood detector which decodes the information from an output signal of the equalizer by use of maximum-likelihood detection.

The present invention provides a signal processing method utilizing a partial response to record information on a medium and then regenerate the information from the medium, wherein a record signal recorded on the medium is subjected to the convolution of $$(1-D)$$

where D: one (1) bit delay operator, and wherein a regeneration signal from the medium is subjected to an equalizing process including the convolution of $$(k-s \cdot D) \cdot (1+D)^n$$

where D: one (1) bit delay operator,
k, s: positive integer, and
n: positive integer, except 2.

The information is decoded from the thus equalized signal by use of maximum-likelihood detection.

By performing the convolution of (k−s·D) in the regenerating system, in addition to the convolution of (1−D) for input signals in the recording system (which has no effect to reduce low-frequency noises), the present invention can reduce noises in the low-frequency band. By performing the convolution of (1−D) in the regenerating system, the present invention can reduce noises in the high-frequency band. Also, by making the convolution as (k−s·D) and optimizing k and s, it is possible to obtain optimum filter characteristics suitable for characteristics of the medium noises and improve the error rate.

The present invention provides a signal processing circuit utilizing a partial response to record information on a medium through a recording system and regenerate the information from the medium through a regenerating system, wherein the recording system includes a circuit unit subjecting a record signal recorded on the medium to the convolution of $$(1-D)$$

where D: one (1) bit delay operator, and wherein the regenerating system includes an equalizer subjecting an output signal from the medium to the convolution of $$(k-s \cdot D) \cdot (1+D)^n$$

where D: one (1) bit delay operator,
k, s: positive integer, and
n: positive integer, except 2.

A maximum-likelihood detector is further disposed which decodes the information from an output signal of the equalizer by use of maximum-likelihood detection.

The present invention provides a signal recording/regenerating apparatus utilizing a partial response to record information on a medium through a recording system and regenerate the information from the medium through a regenerating system, wherein the recording system includes a circuit unit subjecting a record signal recorded on the medium to convolution of $$(1-D)$$

where D: one (1) bit delay operator, and wherein the regenerating system includes an equalizer subjecting a regeneration signal from the medium to the convolution of $$(k-s \cdot D) \cdot (1+D)^n,$$

where D: one (1) bit delay operator,
k, s: positive integer, and
n: positive integer, except 2.

A maximum-likelihood detector is further disposed which decodes the information from an output signal of the equalizer by use of maximum-likelihood detection.

BRIEF DESCRIPTION OF DRAWINGS

FIG. 36A to FIG. 36I are time charts of record regeneration by (1−D)·(3−2D)·(1+D)$^2$ PRML.

BEST MODE FOR CARRYING OUT THE INVENTION

Figure 5:
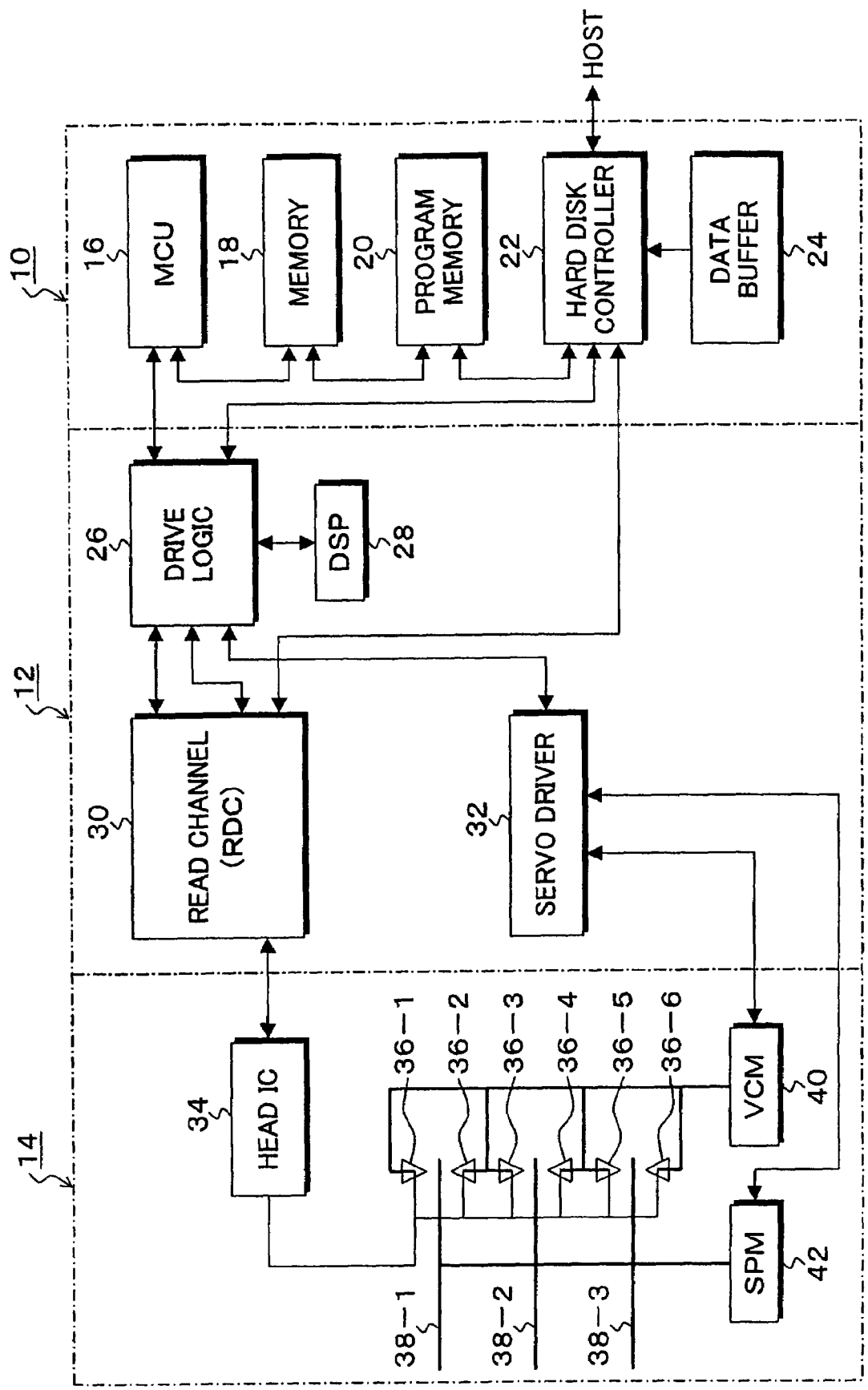
FIG. 5 is a block diagram of a hard disk drive to which the present invention is applied.

FIG. 5 is a block diagram of a hard disk drive to which the present invention is applied. In FIG. 5, the hard disk drive consists of a SCSI controller 10, a drive control 12 and a disk enclosure 14. Of course, an interface with a host is not limited to the SCSI controller 10, and any suitable interface controllers may be used. The SCSI controller 10 is provided with MCU (Main Control Unit) 16, a memory 18 using DRAM or SRAM used as a control storage, a program memory 20 using a non-volatile memory such as a flash memory storing a control program, a hard disk controller (HDC) 22 and a data buffer 24. The drive controller 12 is provided with drive logic 26, DSP 28, a read channel (RDC) 30 and a servo driver 32. Also, the disk enclosure 14 is provided with a head IC 34, and compound heads 36-1 to 36-6 having recording heads and regenerating heads are connected to the head IC 34. The compound heads 36-1 to 36-6 are provided to each recording surface of magnet disk units 38-1 to 38-3, and moved to any track positions of the magnet disk units 38-1 to 38-3, by driving a rotary actuator with VCM 40. The magnet disk units 38-1 to 38-3 is rotated by a spindle motor 42 at a constant speed.

Figure 6:
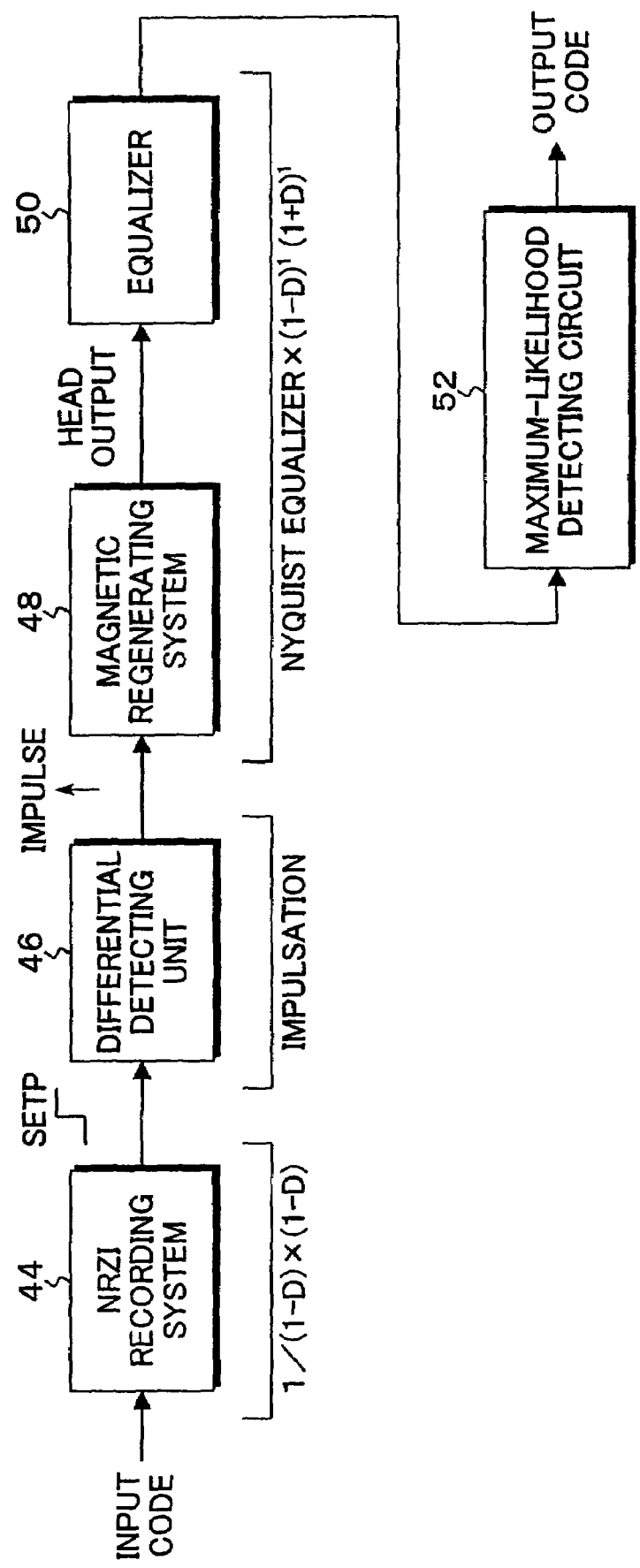
FIG. 6 is a block diagram of a first embodiment of the present invention covering a $(1-D)^2 \cdot (1+D)^1$ PRML structure.

FIG. 6 is a block diagram of a basic structure in a first embodiment of the present invention, and in this first embodiment, (1−D)$^2$·(1+D)$^1$ PRML structure is covered. A magnetic recording/regenerating system in the first embodiment is provided with an NRZI recording system 44, a differential detector 46, a magnetic regenerating system 48, an equalizer 50 and a maximum-likelihood detecting circuit 52. In signal processing in the first embodiment, by step-by-step recording of input codes on the medium in the NRZI recording system 44 at the start, pre-coding of 1/(1−D) and a convolution operation of (1−D) can be performed simultaneously. By performing differential detection of the input codes recorded on the medium with the head as the differential detector 46, impulse generation is performed. At the MR (magnetoresistive effect head), by detecting vertical elements of magnetic flux, the same impulse generation as the differential detector 46 is obtained. As head output, an impulse response waveform of transfer characteristic H(f) of the magnetic regenerating system 48, which determined by frequency characteristic of the medium and the head, is regenerated. The product of the transfer characteristic H(f) of the magnetic regenerating system 48 and transfer characteristic Q(f) of the equalizer 50 is characteristic which is equalizing target of the regenerating system, given by the product of transfer characteristic R(f) of a Nyquist equalizer and (1−D)·(1+D)=G(f).

Therefore the relationship is represented by following equation.

$$H(f) \cdot Q(f) = R(f) \cdot G(f) \tag{1}$$

Figure 4:
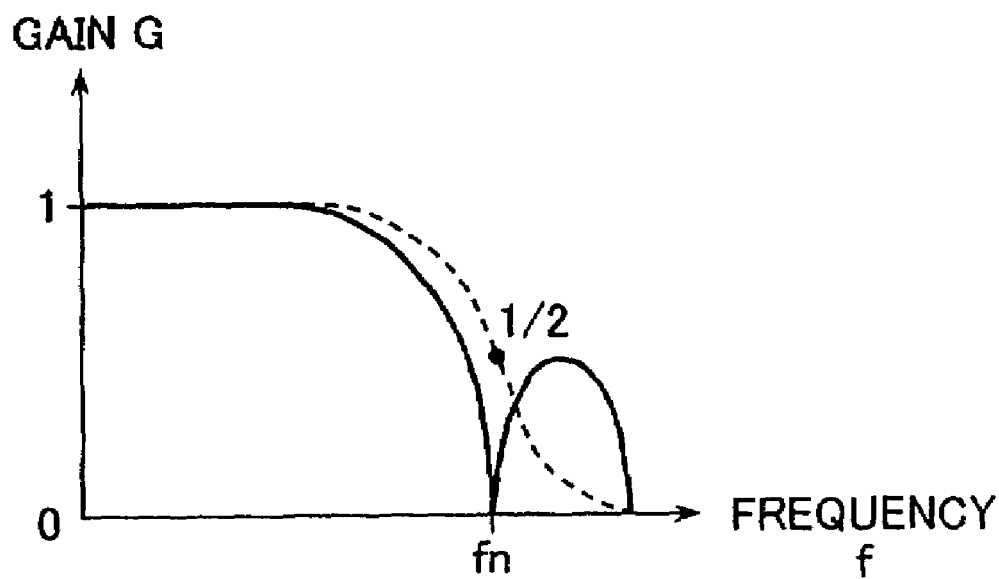
FIG. 4 is a characteristic diagram of an equalizing target in a conventional PR4ML method.
Figure 7:
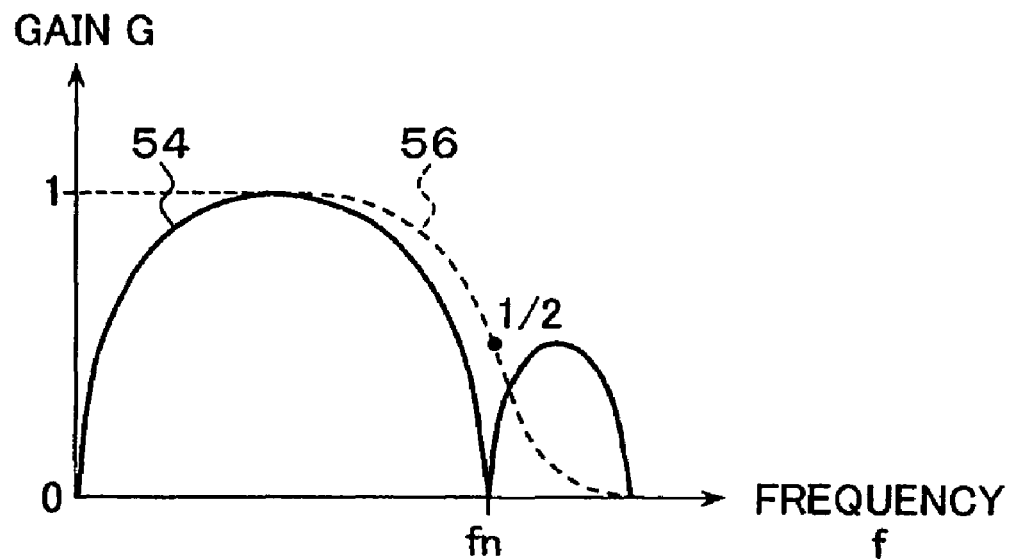
FIG. 7 is a characteristic diagram of an equalizing target of the first embodiment of FIG. 6.

FIG. 7 shows the equalizing target characteristic of the regenerating system in the first embodiment of FIG. 6, given by the equation (1). In this figure, characteristic 56 shown by a dotted line is cosine roll-off characteristic R(f) of the Nyquist equalizer, and fn is a Nyquist frequency. Comparing equalizing target characteristic 54 of first embodiment of FIG. 7 with conventional equalizing target characteristic of FIG. 4, in equalizing target characteristic 54 of first embodiment, gain is substantially reduced in low-frequency band.

Figure 8:
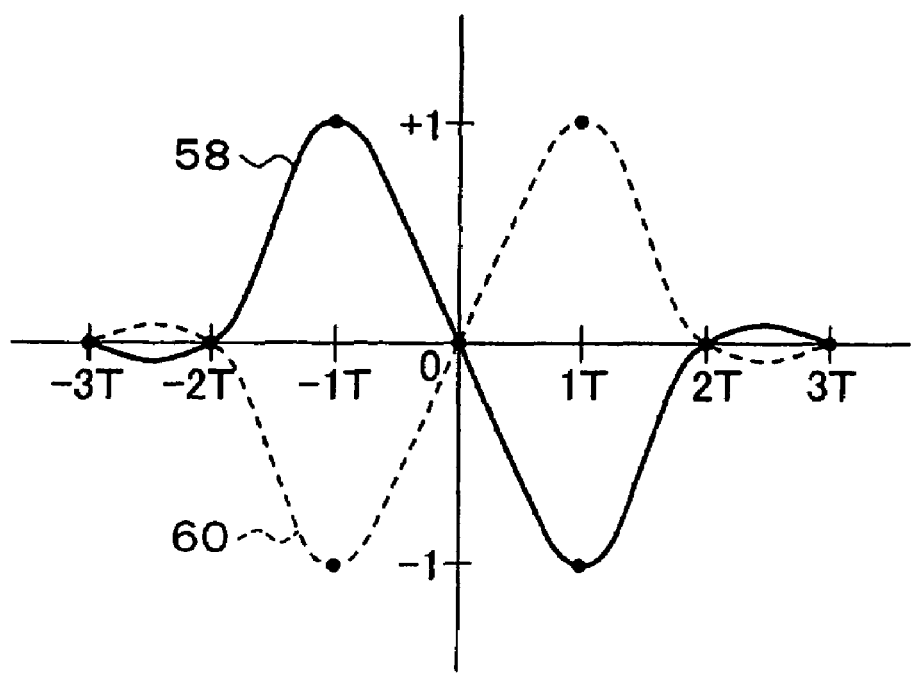
FIG. 8 is a schematic chart of an impulse response waveform represented by an equalizer output of FIG. 6.

The transfer characteristic Q(f) of the equalizer 50 of FIG. 6 to achieve these equalizing target characteristic 54 is adjusted to $$Q(f) = R(f)/\{H(f) \cdot G(f)\} \tag{2}$$

according to the equation (1). In output of the equalizer 50 adjusted to the transfer characteristic Q(f) of the equation (2), an impulse response waveform 58 showing in FIG. 8 is obtained. In this impulse response waveform 58, a partial response equalizing waveform, which becomes +1 at time −1, −1 at time +1T and 0 at other time ±nT (n is integer), is obtained. At this point, time T is T=1/fn. Further, an impulse response waveform 60 shown by the dotted line is a waveform corresponding to a negative impulse. This impulse response waveform is, for convenience of description, shown by a waveform without noises, but actually is in the form with convoluted noises, and fluctuates with the noises around the value.

The maximum-likelihood detecting circuit 52 of FIG. 6 detects the convolution code from the partial response equalizing waveform with the convoluted noises output from the equalizer 50, according to Viterbi algorithm. In the first embodiment, since convolution of (1−D) in the NRZI recording system 44 and convolution of (1−D)·(1+D) in the magnetic regenerating system 48 are performed, by expanding these expression, a following one is obtained.

$$(1-D)^2 \cdot (1+D) = 1-D-D^2+D^3$$

Therefore, it detects the convolution code "1, −1, −1, 1" corresponding to the input code "1", and output an output code.

At this point, in the magnetic regenerating system 48, the convolution of (1−D) to limit the gain in the low-frequency band is represented by (k−s·D) as the general type. Thus, the first embodiment is in the case of k=1 and s=1. Further, the overall convolution, including the recording system and the regenerating system, is generally represented by following one.

$$(1-D) \cdot (k-s \cdot D) \cdot (1+D)^n$$

Therefore, it is understood that, in the first embodiment, the convolution of (1+D)$^n$ to attenuate the gain in the high-frequency band is in the case of n=1.

Figure 9:
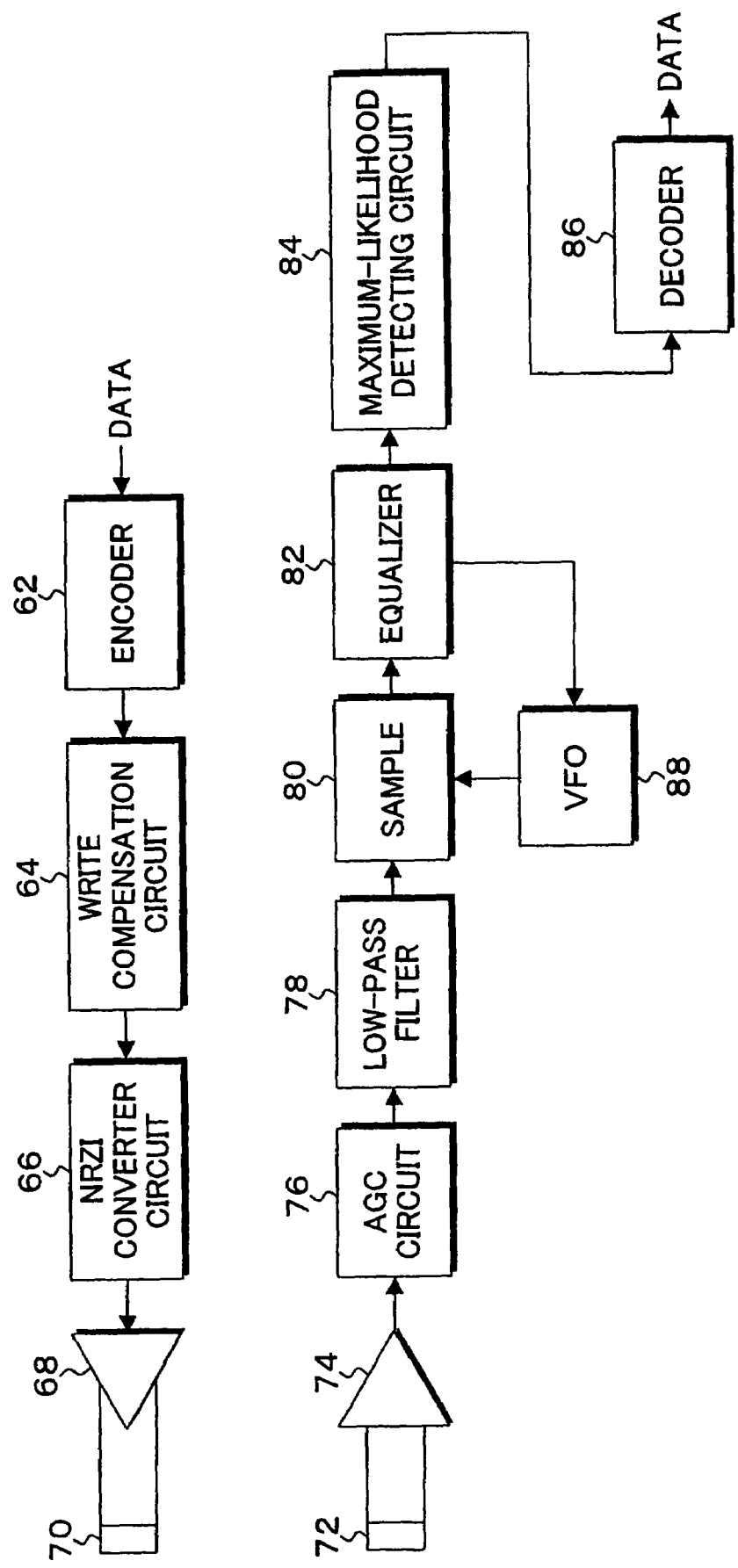
FIG. 9 is a block diagram of a read channel of FIG. 5, according to the first embodiment.
Figure 10:
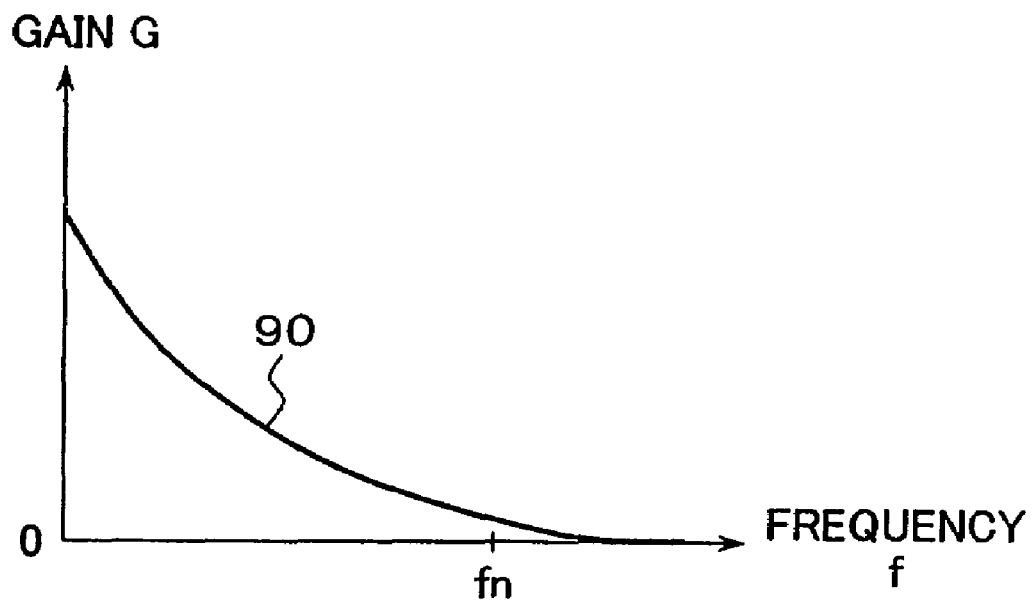
FIG. 10 is a transfer characteristic diagram of a head/medium system in FIG. 9.
Figure 11:
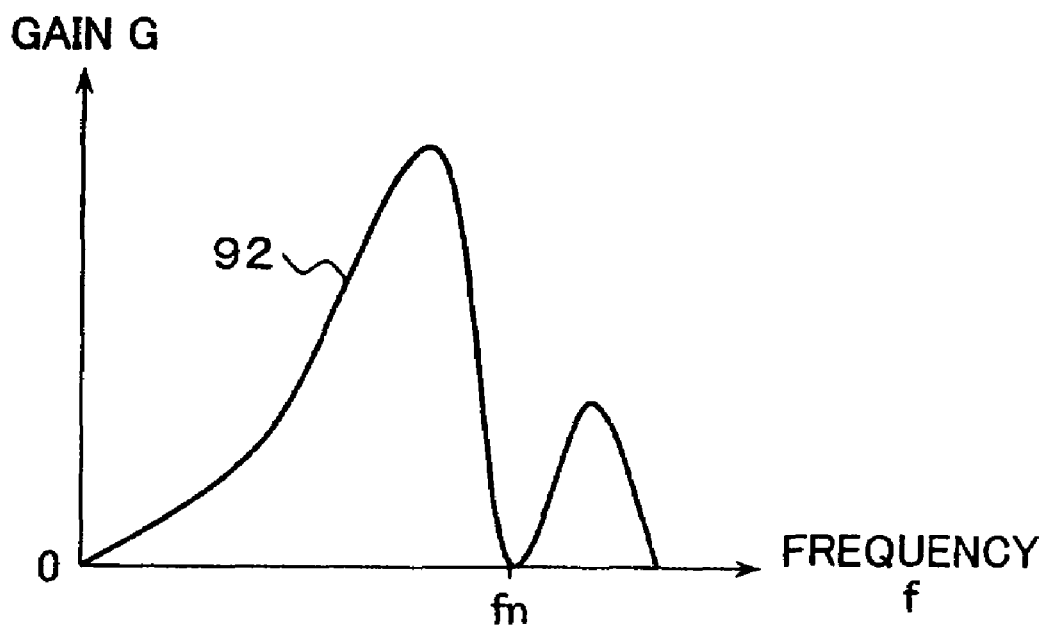
FIG. 11 is a transfer characteristic diagram of an equalizer, including a low-pass filter, of FIG. 9.

FIG. 9 is a block diagram when applying the first embodiment of the present invention of FIG. 6 to a read channel 30 used in a hard disk drive of FIG. 5. In FIG. 9, the recording system consists of an encoder 62, a write compensation circuit 64, an NRZI converting circuit 66, a write amplifier 68 and a write head 70. The regenerating system consists of a read head 72, a pre-amplifier 74, AGC circuit 76, a low-pass filter 78, a sample circuit 80, an equalizer 82, a maximum-likelihood detecting circuit 84, a decoder 86 and a VFO circuit 88. For the read channel of FIG. 9, the operation thereof is described as bellow. Input data is converted to the code that the number of successive zero (0) is limited, such as the 8/9 RLL code, on the encoder 62. The write compensation circuit 64 moves the recording location slightly in advance to compensate NLTS (Non-Linear Transition Shift). The NRZI converting circuit 66 is composed of single-step flip-flop, and converts RZ (Return to Zero) code to NRZI (Non-Return to Zero Interleave) code. In this conversion on the NRZI converting circuit 66, pre-coding of 1/(1−D) and convolution operation of (1−D) are performed effectively. The write amplifier 68 sends a recording current corresponding to the data to the write head 70, activates it, and makes it magnetically record the data on the medium which is not shown. The read head 72 has differential detecting characteristic to detect change in magnetization of the medium, therefore the data recorded step-by-step is detected by the read head 72 as differentiated impulses. At the same time, since the medium has the transfer characteristic corresponding to the frequency characteristic thereof, the impulse response waveform known as the approximate expression of Lorentz is output from the read head 72. This characteristic H(f) determined by the frequency characteristics of the medium and the head would be, for example, as shown in the transfer characteristic 90 of FIG. 10, the characteristic being larger in the lower-frequency band, and more attenuated in the higher-frequency. Referring to FIG. 9 again, after amplified by pre-amplifier 74, the head regeneration signal is additionally controlled at constant amplitude at the AGC circuit 76, and its unnecessary noises are removed by the low-pass filter 78. The low-pass filter 78 constitutes a part of the equalizer 82 in the subsequent stage. The sample circuit 80 samples and holds the regeneration signal with the clock from the VFO circuit 88, or digitizes with an A/D converter. The equalizer 82 consists of a transversal filter and the like, the transfer characteristic thereof is coordinated so that the product with the transfer characteristic of the low-pass filter 78 in the preceding stage becomes the transfer characteristic Q(f) which is represented by the equation (2). The equalizer 82 may be the adaptable type which performs automatic coordination corresponding to the regeneration signal. FIG. 11 shows the transfer characteristic of the equalizer 82 including the low-pass filter 78, as schematic characteristic 92. The equalizer transfer characteristic Q(f) given by the characteristic 92 in the first embodiment would be characteristic substantially attenuated in the low-frequency band and boosted in high-frequency band, then attenuated with Nyquist frequency fn. Referring to FIG. 9 again, the VFO circuit 88 is one which generates a clock signal synchronized to the regeneration signal, and may be achieved with the method disclosed in, for example, publication No. JP1-143447. Also, by splitting the equalizer circuit 82 into parts of a (1+D) filter and a (1−D) filter, and inputting the output of the (1+D) filter into the VFO circuit 88, it is achieved by prior art.

Figure 12:
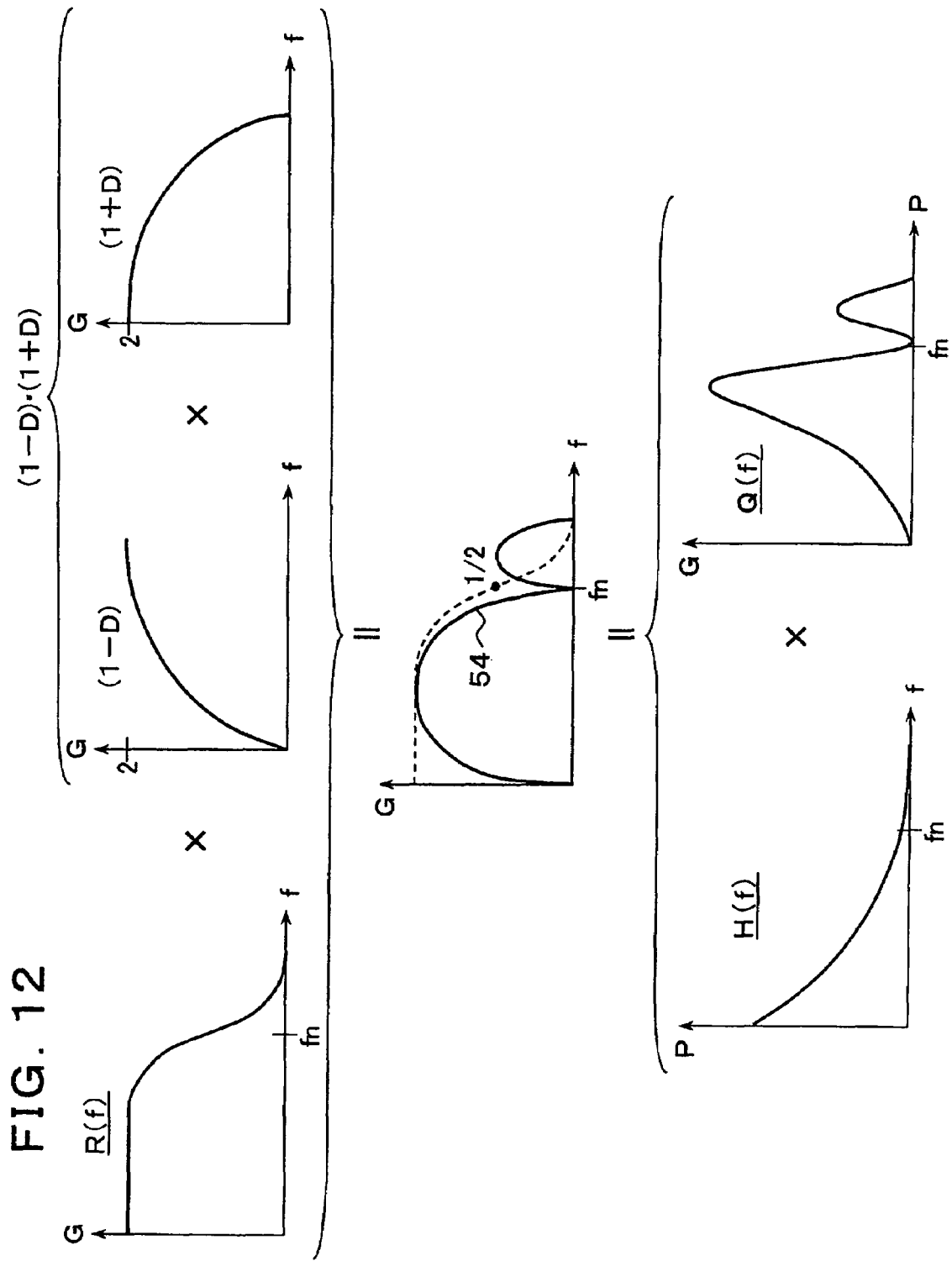
FIG. 12 is a schematic diagram representing relationship of $H(f) \cdot Q(f) = R(f) \cdot G(f)$, which gives equalizing target characteristic of FIG. 7, by transfer characteristic diagrams.

FIG. 12 shows the relationship of the equation (1) which gives equalizing target characteristic 54 of FIG. 7, by transfer characteristic diagrams.

In FIG. 12, the right side of the equation (1) is given by the product of the cosine roll-off characteristic R(f) of the Nyquist equalizer and G(f) which is convolution of (1−D)·(1+D), as shown by the upper part of FIG. 12. Also, the left side of the equation (1) is the product of the transfer characteristic H(f) of the magnetic regenerating system and the equalizer transfer characteristic Q(f), as shown by the lower part of the figure, and this gives the equalizing target characteristic 54 in the middle part. Therefore, from the equation (2) which is obtained by dividing the equalizing target characteristic 54, given by the R(f)×G(f), by the transfer characteristic H(f) of the magnetic regenerating system, the transfer characteristic Q(f) of the equalizer 82 to be adjusted may be obtained.

Now, the maximum-likelihood detecting circuit 84 of FIG. 9 is described. The maximum-likelihood detecting circuit 84 operates so that the convolution code "1, −1, −1, 1" is detected with Viterbi algorithm, in time sequence, from the partial response equalizing waveform output from the equalizer 82.

Figure 13:
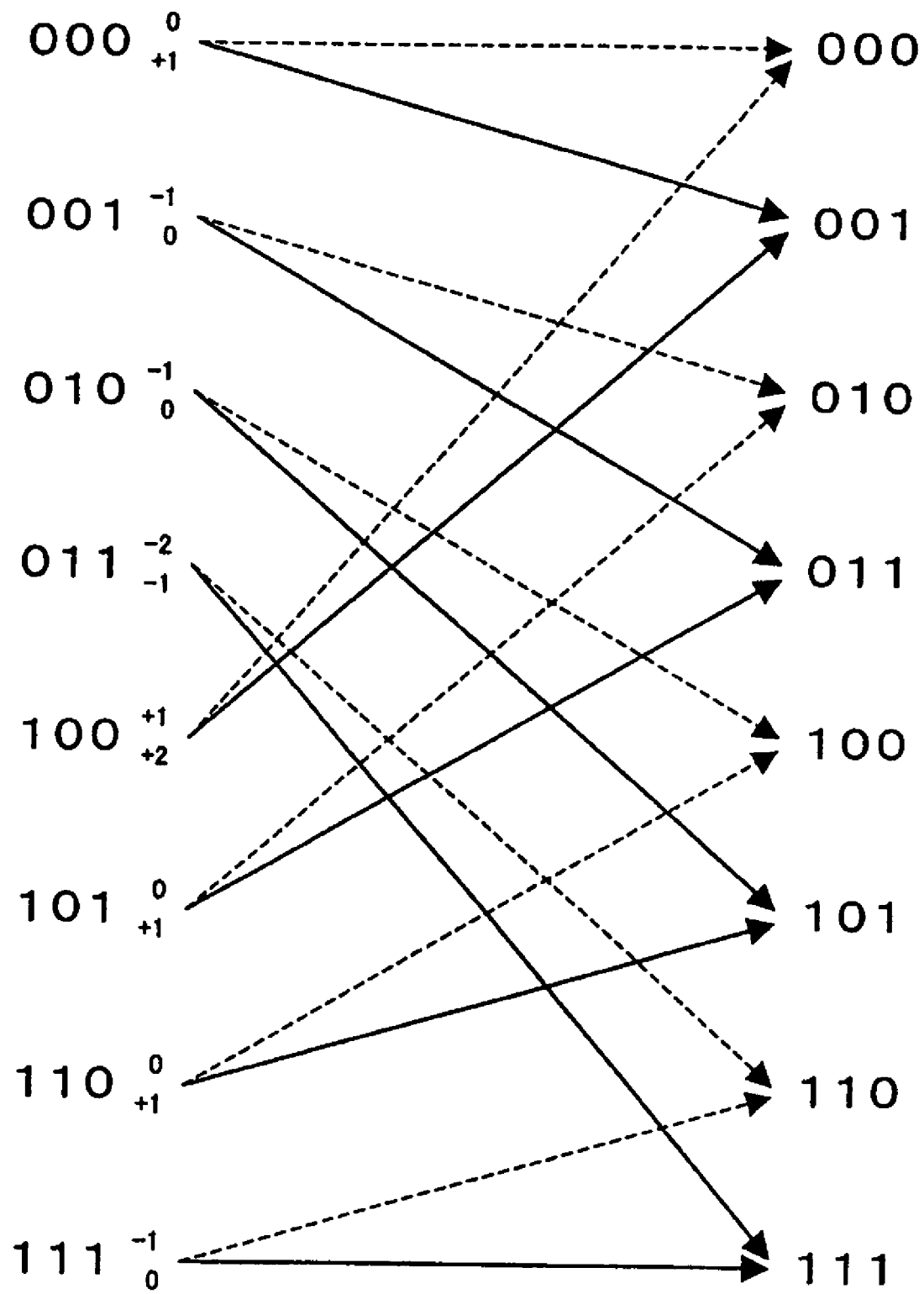
FIG. 13 is a trellis diagram used by a maximum-likelihood detecting circuit of FIG. 9.

FIG. 13 is a trellis diagram showing possible combinations of the convolution code "1, −1, −1, 1". In this trellis diagram, eight (8) nodes related to three (3) bits from (n−3) bit to (n−1) bit of the left part are illustrated. In the right part, three (3) bits from (n−2) bit to n bit, which are advanced one (1) bit, are illustrated, and the next bit is "0" or "1", so if the next bit is "0", transition to the condition of dotted line will be occur, and if the next bit is "1", transition to the condition of solid line will be occur. Further, possible voltage values at this point are shown above and bellow the three (3) bits in the left part. The voltage values take values "+2, +1, 0, −1, −2" which is combined by addition when the convolution code "1, −1, −1, 1" is mismatched within the overlapping range. Since, when convoluting one (1) bit into four (4) bits, the constraint length=4, leading three (3) bits are affected by preceding bits, but the forth bit is not affected, and determined uniquely. For example, when the leading three (3) bits from (n−3) bit to (n−1) bit are "000", if the voltage value is 0, nth bit will move to "0" as the top dotted line, and if the voltage value is +1, nth bit will move to "1" as the next solid line. Now, the maximum-likelihood detecting method using the trellis diagram of FIG. 13 is described. In the principle of the maximum-likelihood detection, by squaring the difference between the voltage values considered to be the trellis diagram target and the actual sample voltage (not matched to the target voltage value, because of the noises), and cumulatively adding the results for each bit, the cumulative square error is obtained. After obtaining the cumulative square errors for all the possible combination shown in the trellis diagram, the combination (path) which has the smallest cumulative square error is detected as one with maximum-likelihood.

Figure 14:
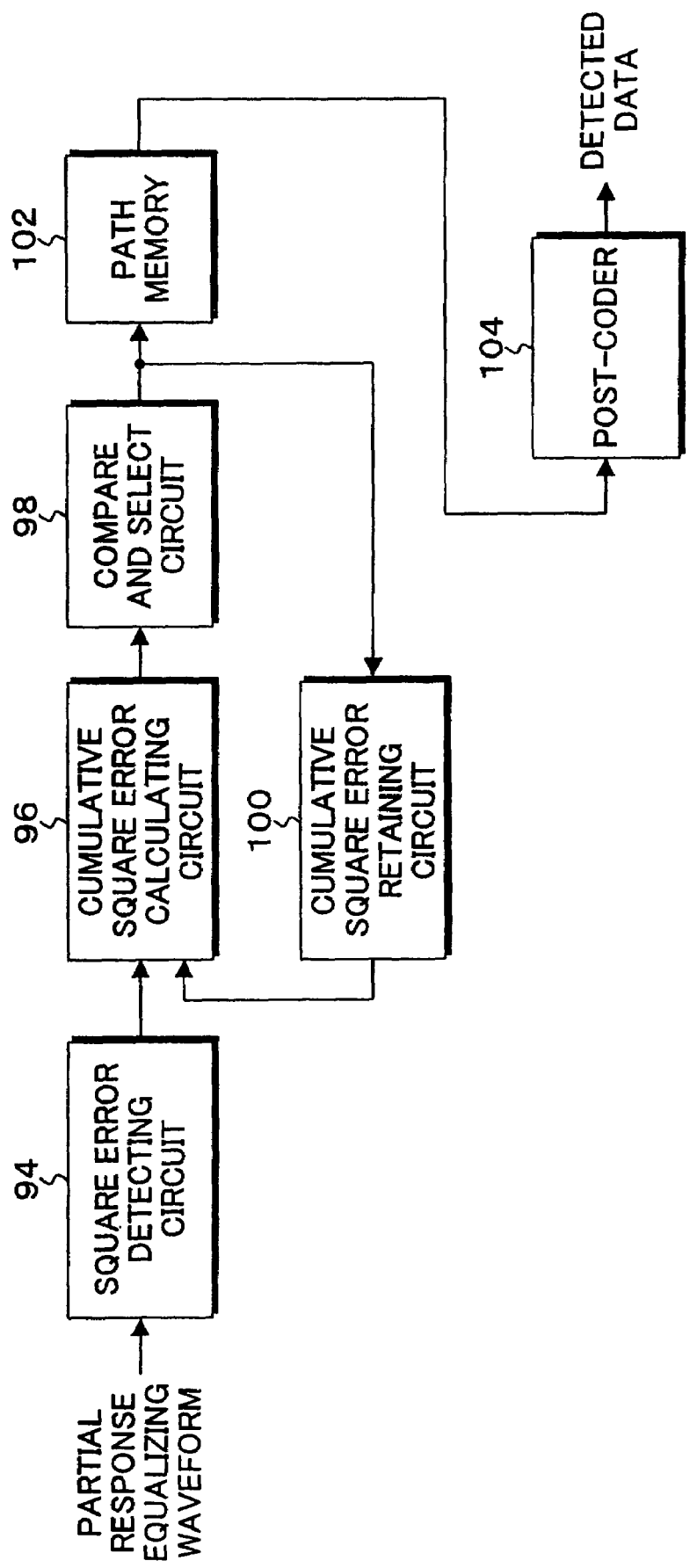
FIG. 14 is a block diagram of the maximum-likelihood detecting circuit of FIG. 9.

FIG. 14 is a block diagram showing a concrete example of the maximum-likelihood detecting circuit 84 of FIG. 9. In a cumulative square error detecting circuit 94, the square error is detected from difference between 16 voltage values which is considered to be targets of the trellis diagram in FIG. 13 and the sample values of the partial response equalizing waveform. A cumulative square error retaining circuit 100 retains eight (8) node cumulative square errors corresponding to eight (8) nodes in the trellis diagram of FIG. 13. A cumulative square error calculating circuit 96 calculates new 16 branch cumulative square errors by adding eight (8) node cumulative square errors and 16 node cumulative square errors, respectively. A compare and select circuit 98 compares the branch cumulative square errors indicated by two arrows related to each node in the right part of the trellis diagram of FIG. 13, determines that smaller data has higher likelihood, and outputs the data and select signals to a path memory 102.

Simultaneously, it outputs the branch cumulative square error corresponding to the selected data to the cumulative square error retaining circuit 100 as new node cumulative square error for that node. The path memory 102 consists of multi-stage registers recording the selected path, records the selected data from the compare and select circuit 98, and copies the data in each stage according to the select signal, as shown in the trellis diagram of FIG. 13. In this way, one half of paths continues to exist in each stage, and the other half disappears. By repeating these comparison and selection of the paths, the path with maximum-likelihood will continues to exist till the last, and the maximum-likelihood detection will be done. The detected code considered as one with maximum-likelihood in path memory 102 is processed in a post-coder 104 into the detected data, and finally, by 9/8 conversion in the decoder 86 of FIG. 9, into the data.

Figure 15:
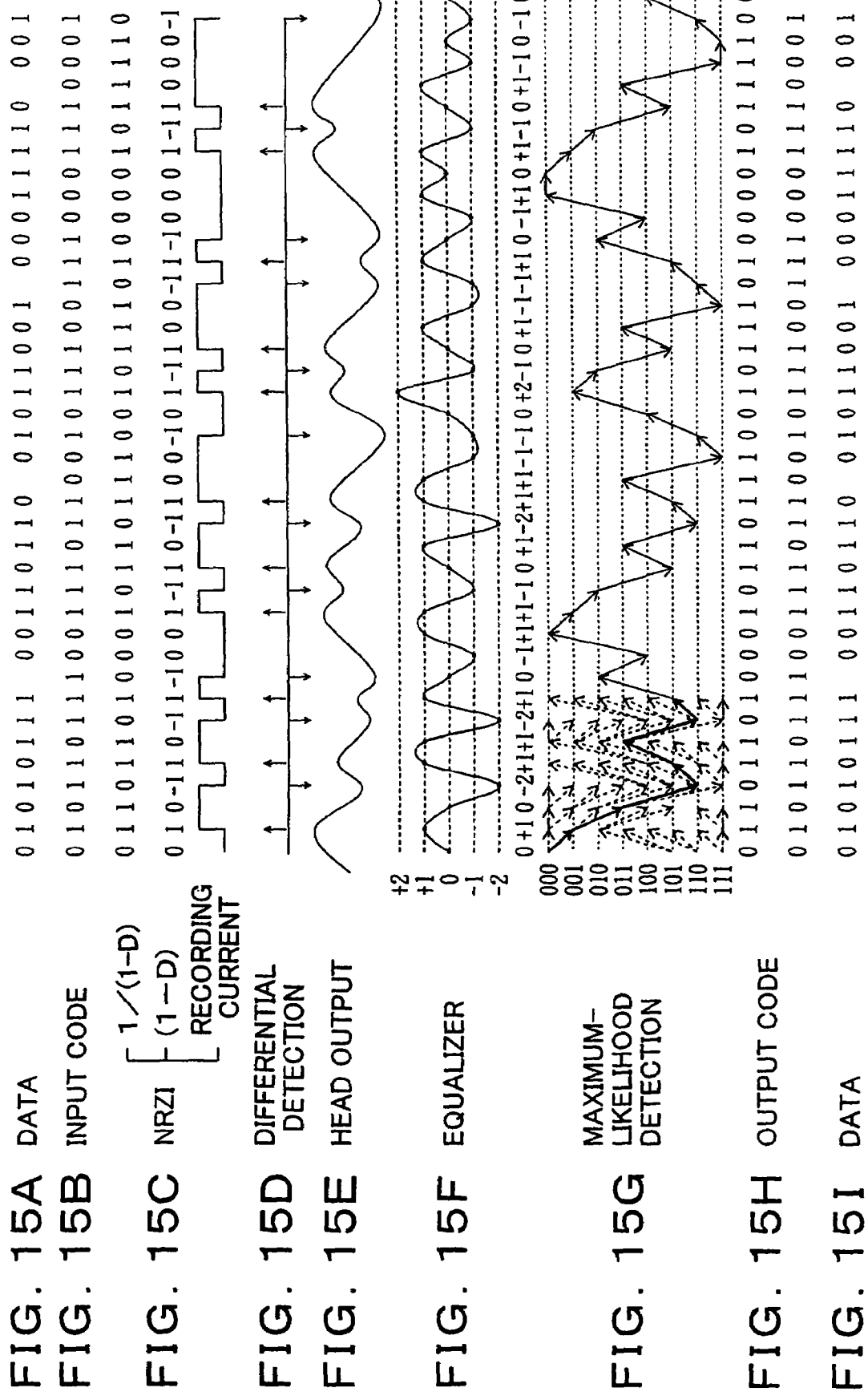
FIG. 15A to FIG. 15I are time charts of record regeneration by $(1-D)^2 \cdot (1+D)^1$ PRML.

FIG. 15A to FIG. 15I are time charts which give detail description of process in the recording/regenerating systems of FIG. 9 and FIG. 14. The data of FIG. 15A is converted to 8/9 RLL code in which every eight (8) bits is converted to nine (9) bits, and becomes the input data of FIG. 15B. In the process of NRZI converting circuit 66, 1/(1−D) is calculated firstly, and this is equivalent to applying the logic operation exclusive-OR to the input code and the last data before the result of 1/(1−D) operation. The convolution of (1−D) is equivalent to subtracting the 1/(1−D) operation result which is delayed once. These 1/(1−D) and (1−D) operations are equivalently performed in the single-stage flip-flop of the NRZI converting circuit 66. Further, the write amplifier drives the write head 70, so that the direction of recording current is reversed whether the value is "1" or "−1". The signal recorded on the medium is converted to impulse by differential detecting action of the read head of FIG. 15D, and the impulse response waveform like FIG. 15E is obtained as head output, depending on the transfer characteristics of the medium and the head. The equalizer 82 consists of, for example, 10 tap transversal FIR filters, and, as shown in FIG. 15F, by repeating the adjustment of each tap gain of the equalizer 82 corresponding to the offset amount of the sample point voltage from the five (5) values of ±2, ±1 and 0, automatic adjustment to the target transfer characteristic Q(f) such as FIG. 11 may be performed. An equalizer provided with the automatic adjustment function is called adaptable type equalizer, and the adaptation method thereof is called the steepest descent method. As a result, the sample point voltage output from the equalizer 82 is "+2, +1, 0, −1" as shown by black dots of FIG. 15F, and considered to be the partial response waveform which is subjected to Nyquist equalizing. By the way, the waveform without noises is shown in FIG. 15, for convenience of description, but actually, the waveform has convoluted noises. If the noises are convoluted, the operation of the equalizer 82 doesn't change basically. In the maximum-likelihood detecting circuit 84, the convolution code is detected according to the description of FIG. 14. In FIG. 15G, the solid line shows the path continued to exist through this maximum-likelihood detection, and the dotted lines show the disappeared paths. The data detected by this maximum-likelihood detection method is processed in the post-coder 104 into the output code of FIG. 15H, then, subjected to the 9/8 conversion in the decoder 86 of FIG. 9, and becomes the data of FIG. 15I.

Figure 16:
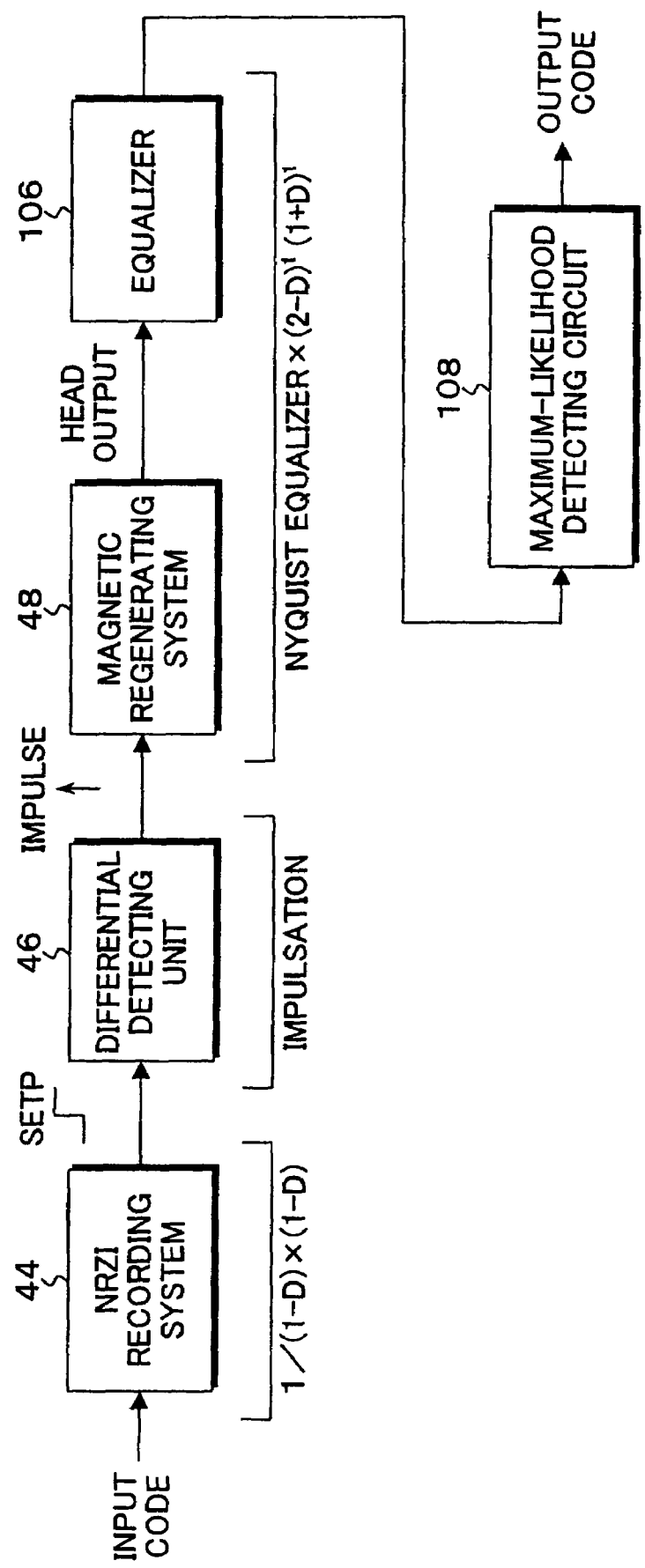
FIG. 16 is a block diagram of a second embodiment of the present invention covering a $(1-D) \cdot (1-2D) \cdot (1+D)^1$ PRML structure.

FIG. 16 is a block diagram of a second embodiment of the present invention, and the second embodiment is wherein (1−D)·(1−2D)·(1+D) PRML structure is covered. In FIG. 16, the second embodiment consists of the NRZI recording system 44, the differential detector 46, the magnetic regenerating system 48, an equalizer 106 and a maximum-likelihood detecting circuit 108. Among these, from the NRZI recording system 44 to the magnetic regenerating system 48 are basically same as the first embodiment in FIG. 6. The transfer characteristic Q(f) of the equalizer 106 is expressed by equation (2), except G(f) in the right side of the equation (2). More specifically, in the second embodiment, the equation is as follows.

$$G(f)=(2-D)\cdot(1+D)^1 \quad (3)$$

Figure 17:
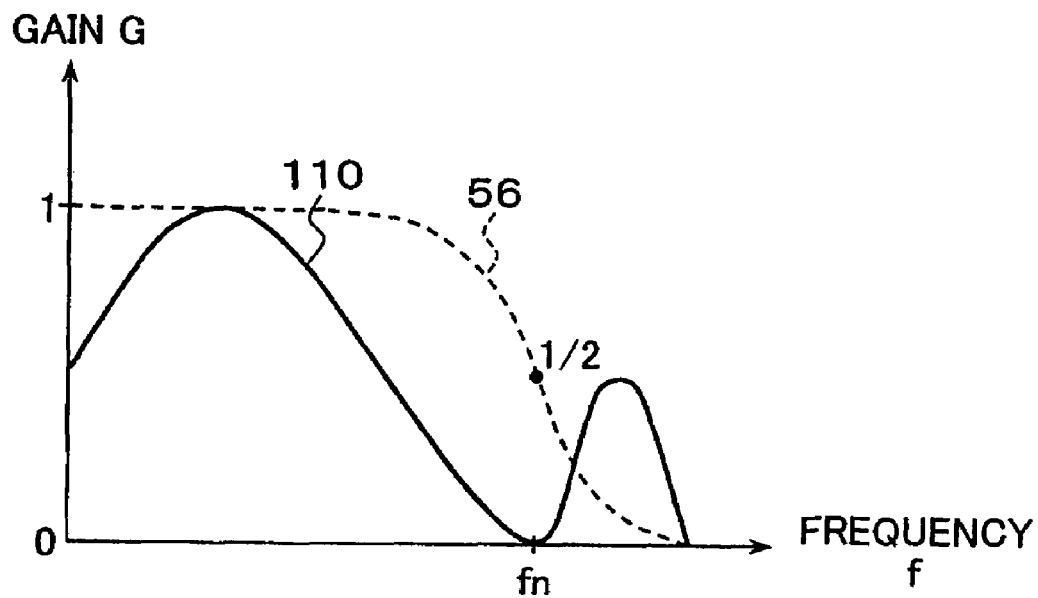
FIG. 17 is a characteristic diagram of an equalizing target of the second embodiment of FIG. 16.
Figure 18:
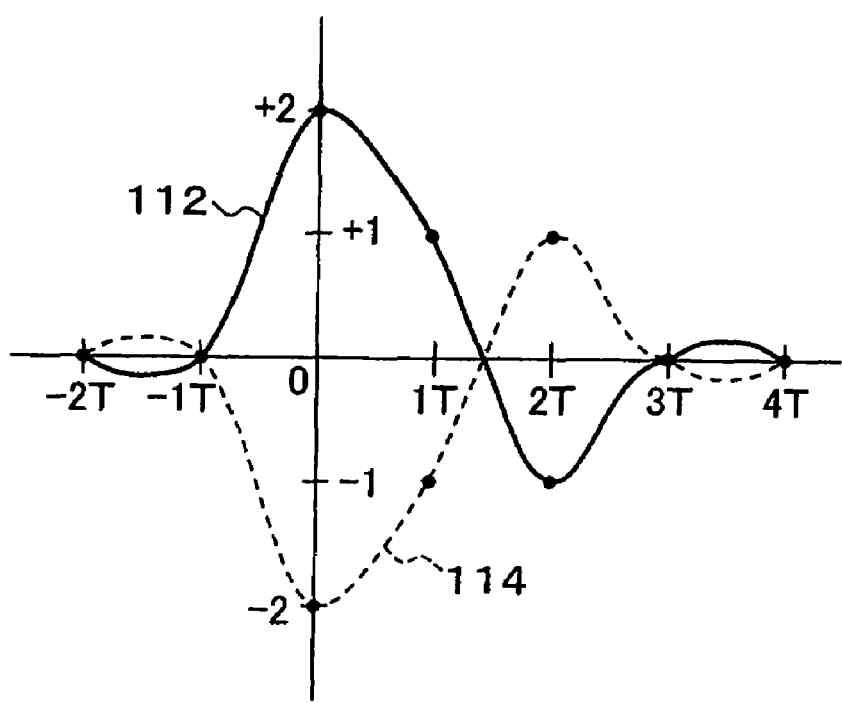
FIG. 18 is a schematic chart of an impulse response waveform represented by an equalizer output of FIG. 16.

In this case, the equalizing target characteristic given by R(f)·G(f) is the characteristic 110 of FIG. 17. It is noted that the characteristic 56 is cosine roll-off characteristic R(f) of the Nyquist equalizer. It is understood that the convolution of (2−D)·(1+D) which is the convolution in the magnetic regenerating system 48 and the equalizer 106 of the first embodiment is in the case of k=2, s=1, and n=1 for the general type (k−s·D)·(1+D)$^n$. From the equalizing target characteristic given by the characteristic 110 of FIG. 17, the impulse response waveform 112 shown by FIG. 18 is obtained from output of the equalizer 106. In this impulse response waveform 112, the partial response equalizing waveform, which is +2 at time 0, −1 at time 1T, −1 at time 2T, and 0 at other times ±nT (n is integer), is obtained. In this figure, the dotted line is the partial response equalizing waveform 114 corresponding to a negative impulse. Further, FIG. 18 shows, for convenience of description, the waveform without noises, but actually it is the waveform with convoluted noises, and fluctuates around the value. The maximum-likelihood detecting circuit 108 of FIG. 16 receives the partial response equalizing waveform with convoluted noise output from the equalizer 106, and detects the convolution code according to Viterbi algorithm. In the second embodiment, the convolution of (1−D) in the recording system and the convolution of (2−D)·(1+D)$^1$ in the regenerating system has been done, therefore, expansion to $$(1-D)\cdot(2-D)\cdot(1+D)=2-D-2D^2+D^3$$

is possible. Therefore, to the input code "1", convolution code "2, −1, −2, 1" is detected, and the output code is output.

Figure 1:
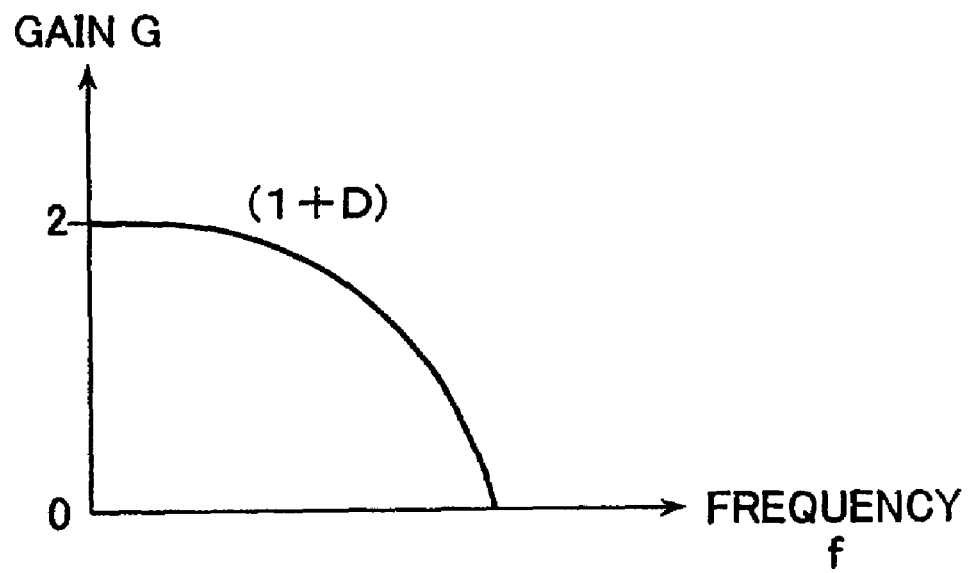
FIG. 1 is a transfer characteristic diagram by the convolution of (1+D) effected in the conventional regenerating system.
Figure 2:
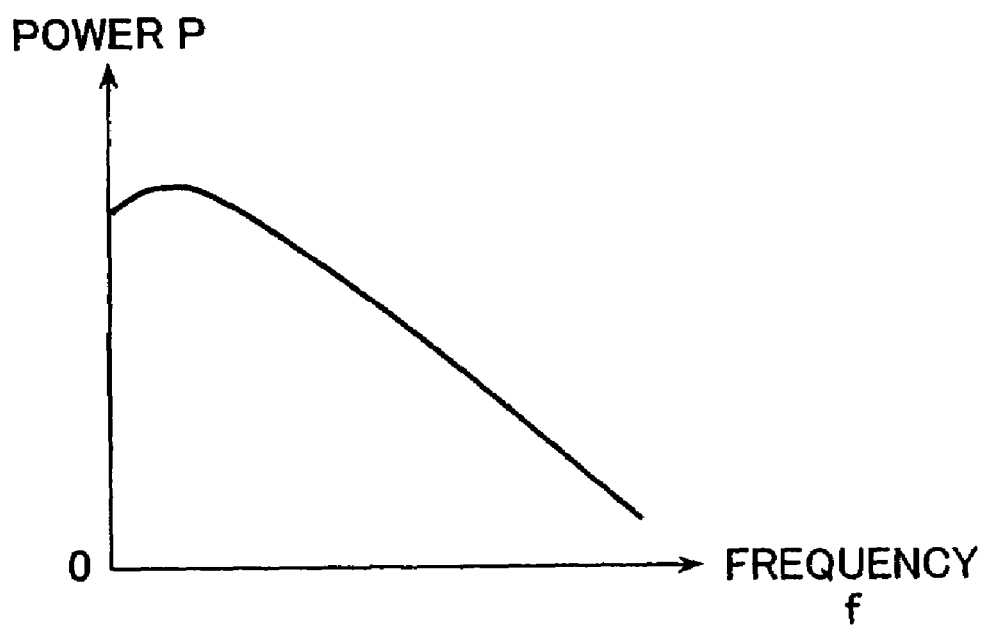
FIG. 2 is a power spectrum characteristic diagram of medium noises.
Figure 3:
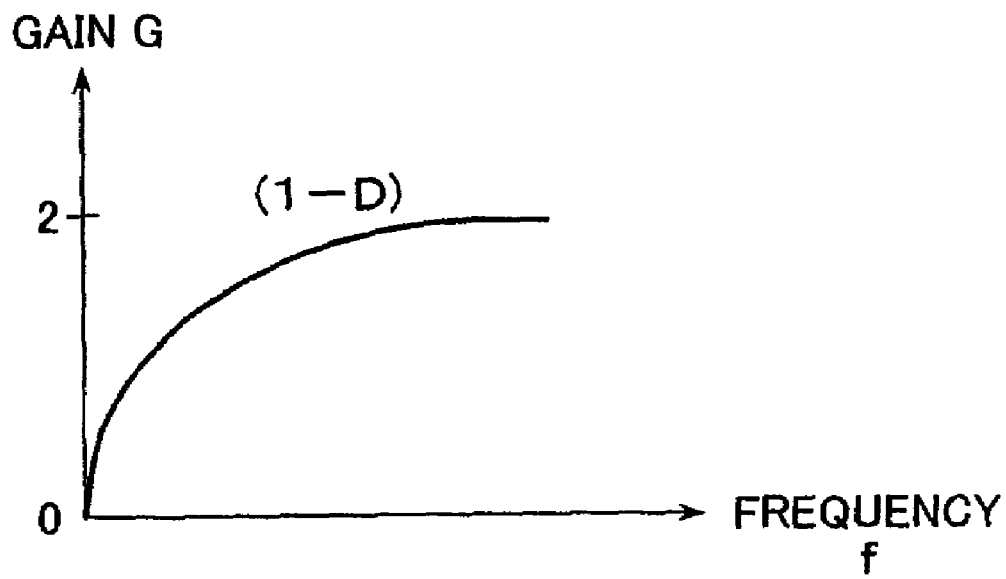
FIG. 3 is a transfer characteristic diagram by the conventional convolution of (1−D) in the recording system.

Now, specific structure in the case that the second embodiment of FIG. 16 is applied to the read channel 30 which is provided to the hard disk drive of FIG. 2 is described. A block diagram in the case that the second embodiment is applied to the read channel 30 is same as the first embodiment of FIG. 9, also the functions thereof from the recording system to the sample circuit 80 of the regenerating system are basically same as the first embodiment of FIG. 9, and the equalizer 82 and the maximum-likelihood detecting circuit 84 have structure and operation unique to the second embodiment. The transfer characteristic Q(f) of the equalizer circuit 84 in the second embodiment, including the transfer characteristic of the low-pass filter 78, is shown by transfer characteristic 116, schematically. In this figure, characteristic 92 shown by a dotted line is the equalizer transfer characteristic of the first embodiment. When comparing the equalizer transfer characteristic 92 of the first embodiment to the equalizer transfer characteristic 116 of the second embodiment, it is understood that, by performing the convolution of (2−D) of the second embodiment corresponding to the convolution of (1−D) of the first embodiment, the gain in the low-frequency band is increased.

Figure 19:
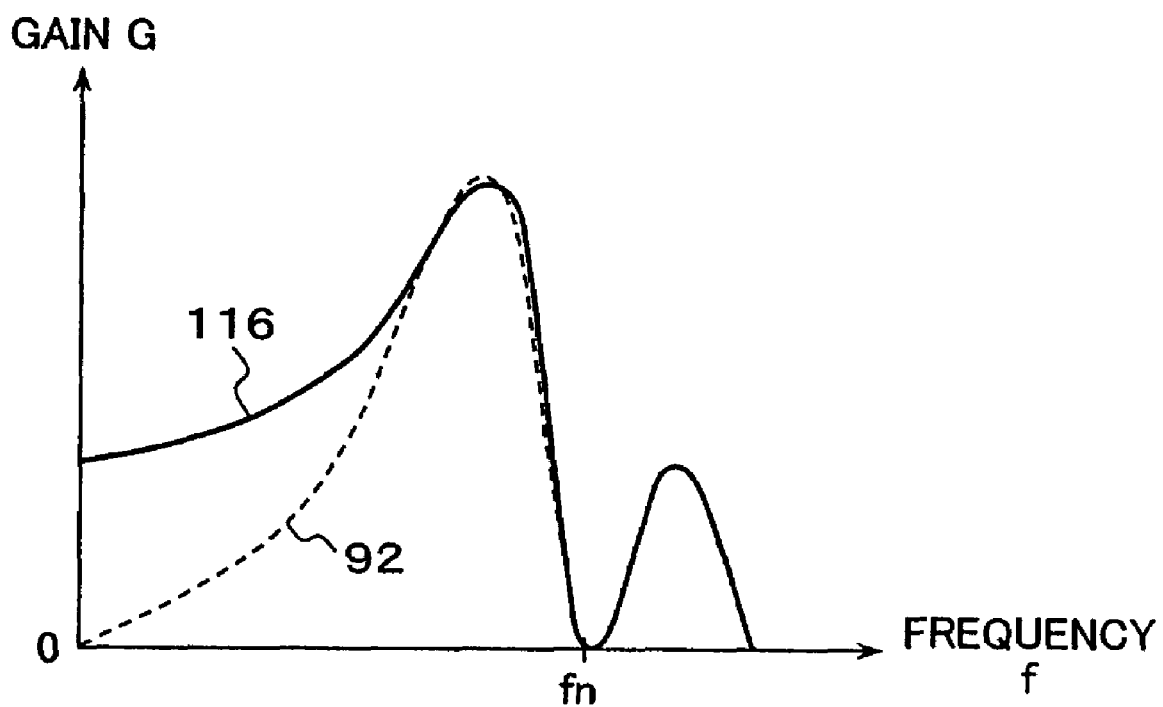
FIG. 19 is a transfer characteristic diagram of an equalizer of FIG. 16.
Figure 20:
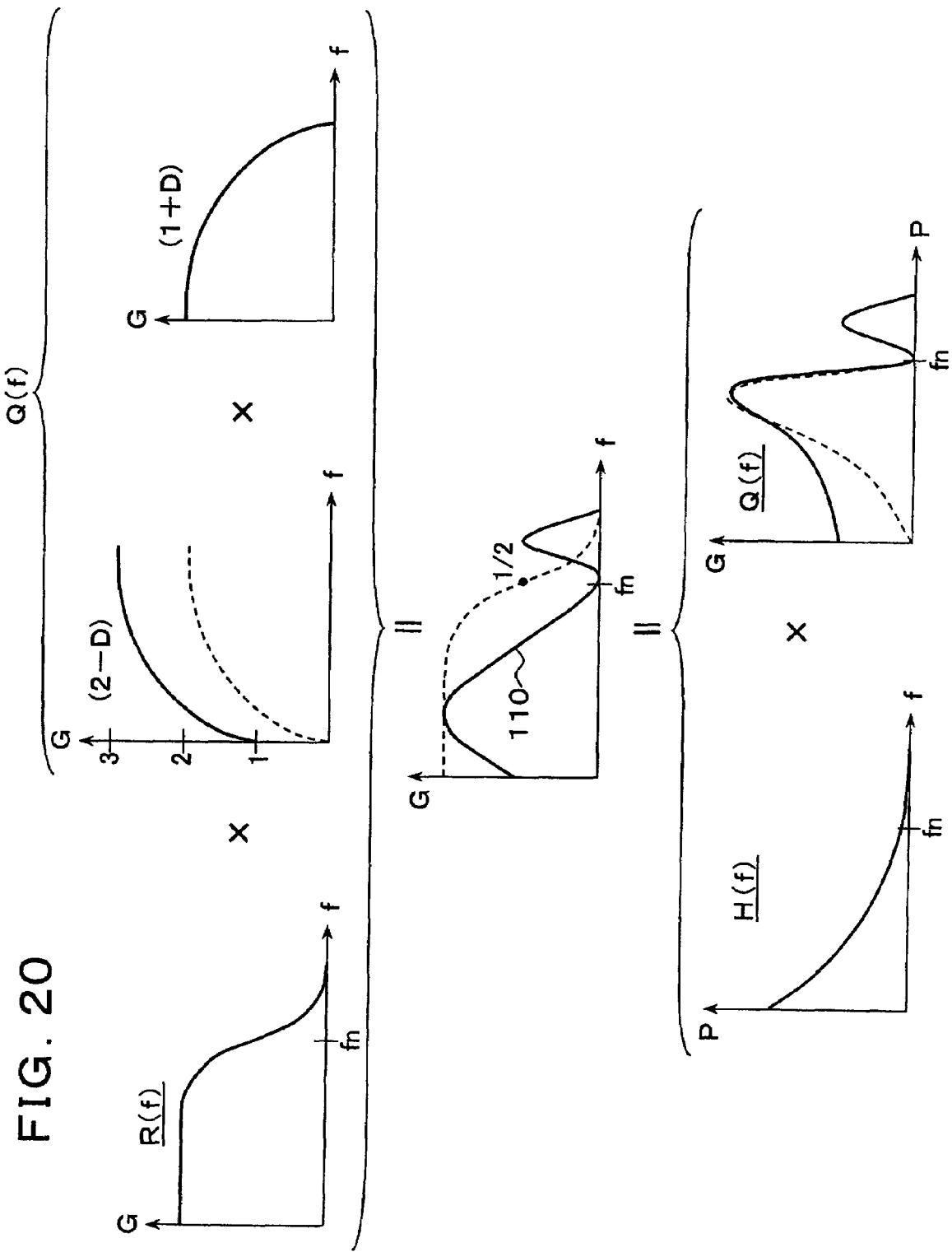
FIG. 20 is a schematic diagram representing relationship of $H(f) \cdot Q(f) = R(f) \cdot G(f)$, which gives equalizing target characteristic of FIG. 17, by transfer characteristic diagrams.

FIG. 20 shows the relationship of the equation (1) which gives equalizing target characteristic 110 of FIG. 17 in the second embodiment, by transfer characteristic diagrams. In FIG. 20, the upper part shows R(f)×G(f) in the right side of the equation (1) wherein G(f) is the convolution in the regenerating system, since, in the second embodiment, the convolution attenuating the low-frequency band is (2−D), the gain in the low-frequency is larger than (1−D) shown by the dotted line of the first embodiment. By multiplication of the G(f) and the cosine roll-off characteristic R(f) of the Nyquist equalizer, equalizing target characteristic 110 of the second embodiment in the middle part of FIG. 19 is obtained. This equalizing target characteristic 110 is equivalent to the product of the transfer characteristic H(f) of the magnetic regenerating system in the left side of the equation (2) and the equalizing transfer characteristic Q(f). Therefore, the equalizing transfer characteristic Q(f) may be adjusted to the characteristic of the equation (2) wherein the equalizing target characteristic 110 given by R(f)·G(f) is divided by the magnetic regenerating transfer characteristic H(f). In this point, the VFO circuit 88 of FIG. 9 used in the second embodiment may be achieved by prior art, by splitting the equalizer 82 into parts of a (1+D) filter and a (1−D) filter, and inputting the output of the (1+D) filter into the VFO circuit 88.

Figure 21:
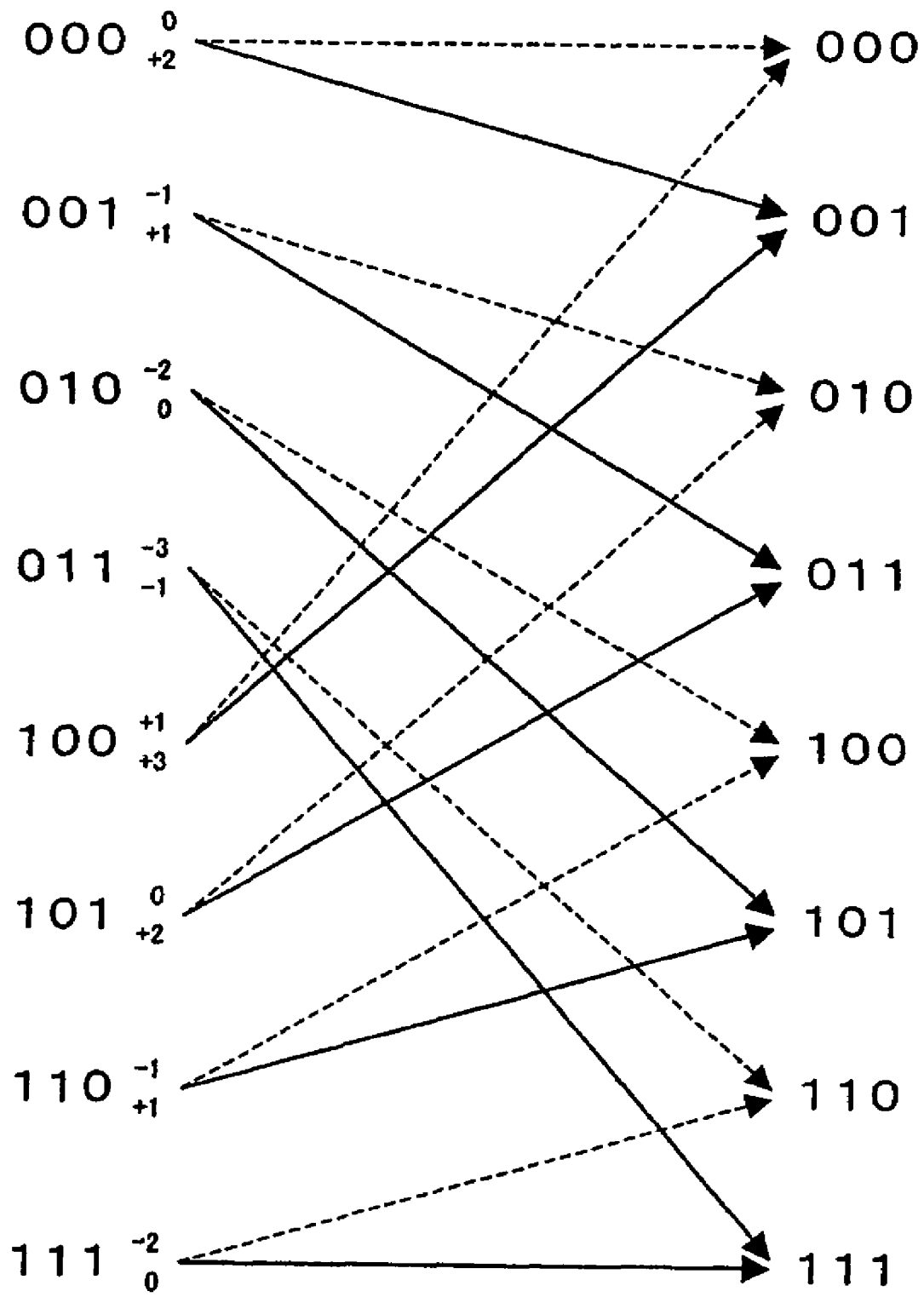
FIG. 21 is a trellis diagram used by a maximum-likelihood detecting circuit of FIG. 16.

The maximum-likelihood detecting circuit of the second embodiment, which is basically same as that of the first embodiment shown in FIG. 14, operates so that the convolution code "2, −1, −2, 1" is detected with Viterbi algorithm, in time sequence. FIG. 21 shows a trellis diagram showing possible combinations of the convolution code of the second embodiment. In this case, again, since one (1) bit is convoluted into four (4) bits, the constraint length=4. The detected code considered as one with maximum-likelihood in this way is processed in a post-coder 104 in FIG. 14 into the detected data, and finally, by 9/8 conversion in the decoder 86, into the decoded data, in the same way as the first embodiment of the FIG. 9.

Figure 22:
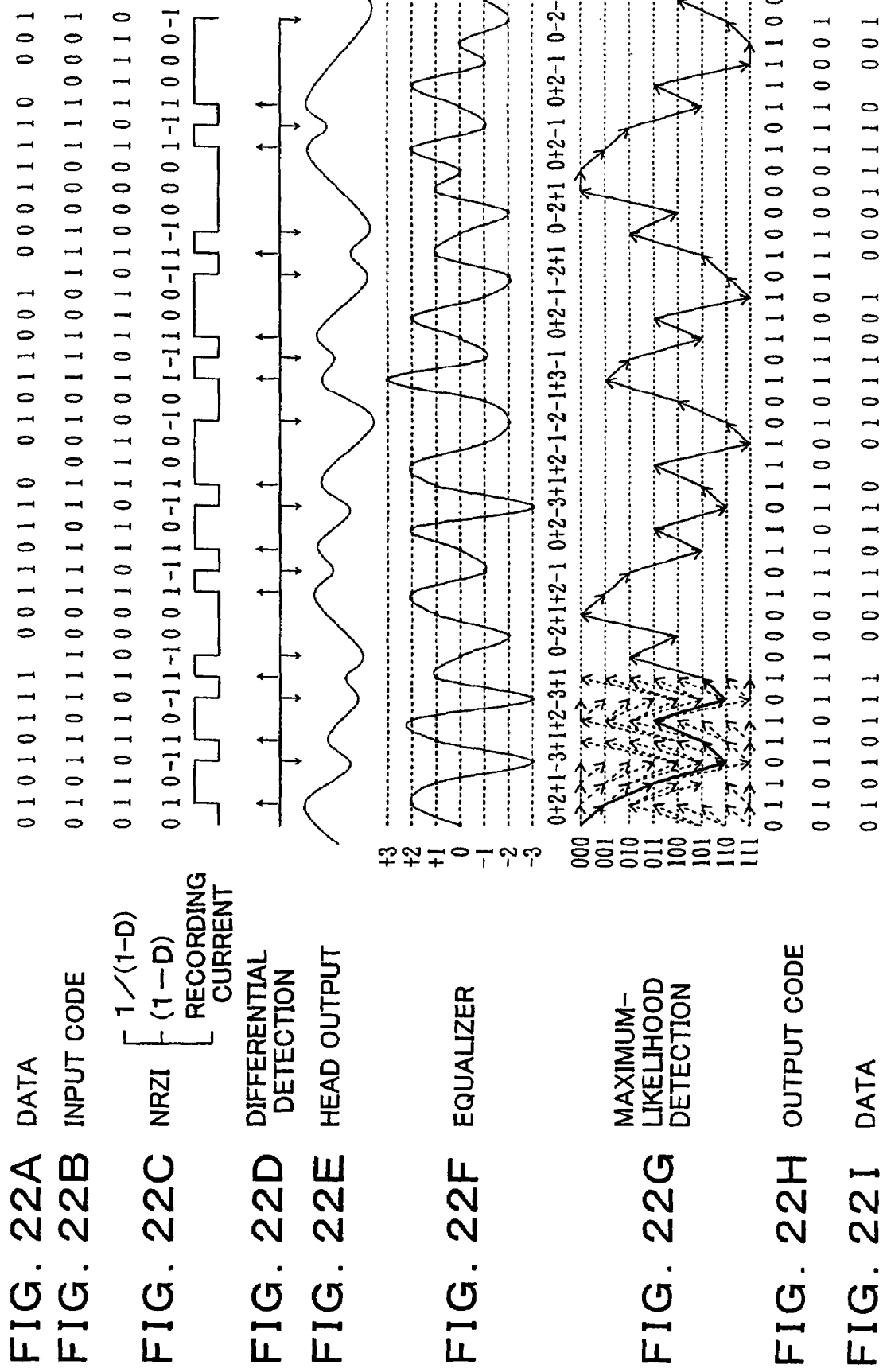
FIG. 22A to FIG. 22I are time charts of record regeneration by $(1-D) \cdot (1-2D) \cdot (1+D)^1$ PRML.

FIG. 22A to FIG. 22I are time charts which show details of recording and regenerating in the second embodiment. Since the data of FIG. 22A to the head output of FIG. 22E are basically same as FIG. 15A to FIG. 15E, those are not described bellow. The equalizer of FIG. 22E consists of, for example, 10 tap transversal FIR filters, and the sample point voltage takes seven (7) values "+3, +2, +1, 0, −1, −2, −3" because of the convolution code of "2, −1, −2, 1" overlapping each other, therefore, the partial response equalizing waveform which is Nyquist equalized is output as shown. The maximum-likelihood detecting circuit of FIG. 22G performs maximum-likelihood detection with Viterbi algorithm according to the trellis diagram in FIG. 21, and output the output code of FIG. 22H. Finally, 9/8 conversion is performed in the decoder, and the data of FIG. 22I is output.

Figure 23:
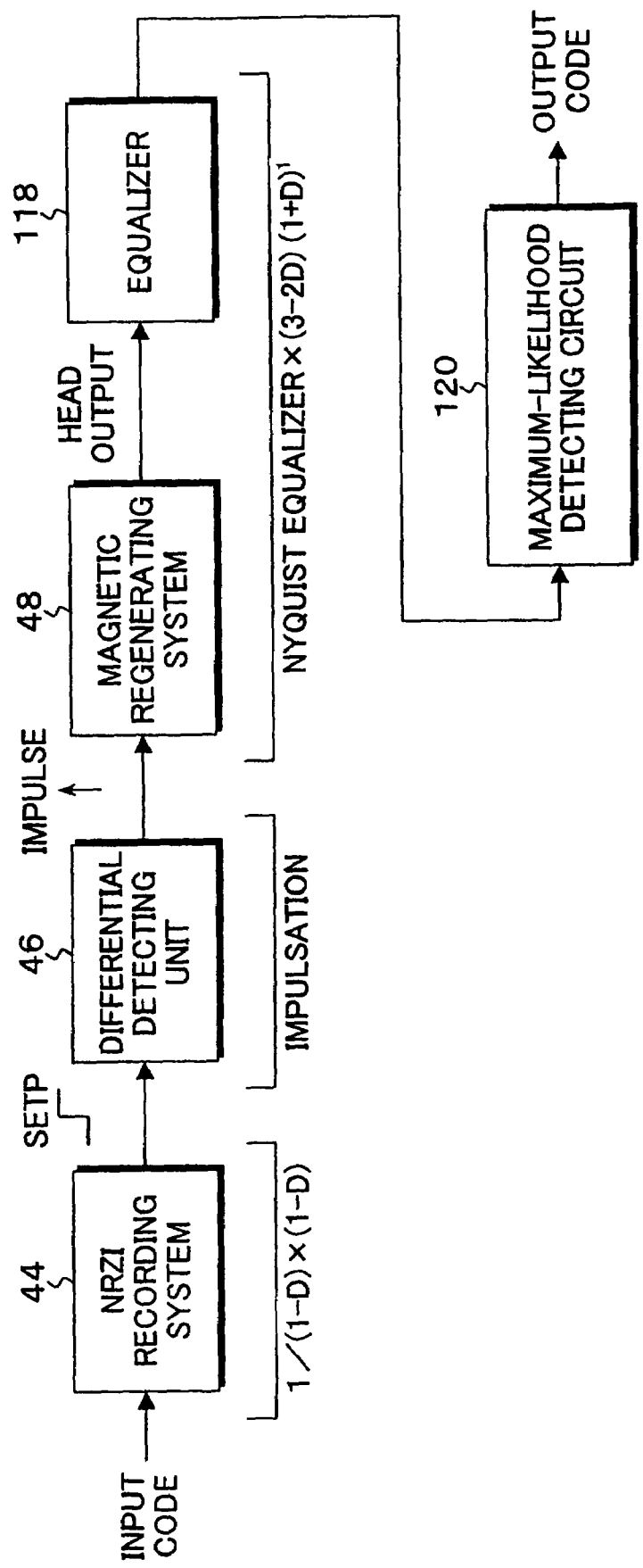
FIG. 23 is a block diagram of a third embodiment of the present invention covering a $(1-D) \cdot (3-2D) \cdot (1+D)^1$ PRML structure.

FIG. 23 is a third embodiment of the present invention, and the third embodiment is wherein $(1-D)\cdot(3-2D)\cdot(1+D)^1$ PRML structure is covered. In the third embodiment, from the NRZI recording system 44 to the magnetic regenerating system 48 are basically same as those of the first embodiment in FIG. 6. The transfer characteristic Q(f) of the equalizer 118 is expressed by equation (2), except the convolution G(f) in the regenerating system in the right side of the equation (2). In the third embodiment, G(f) is $$G(f)=(3-2D)\cdot(1+D)^1.$$

Figure 24:
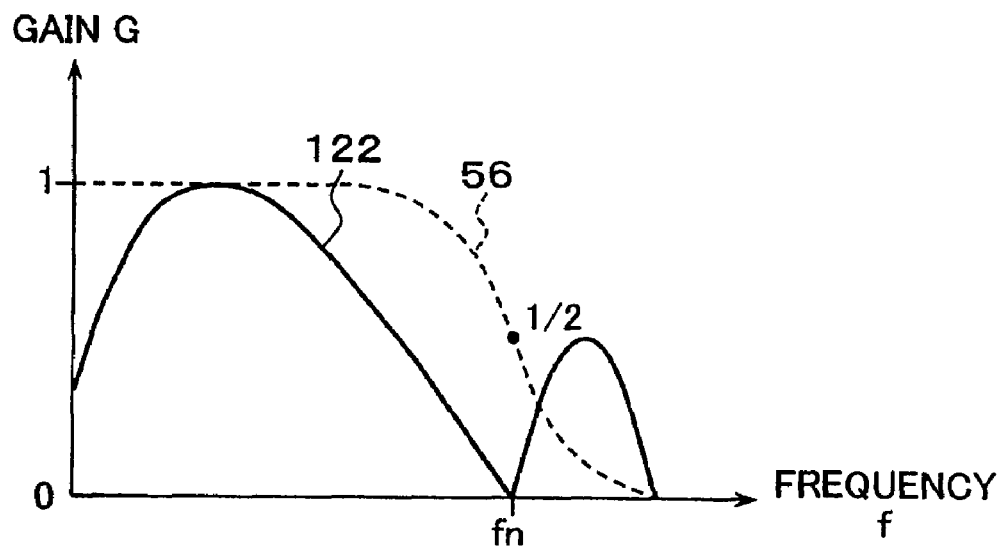
FIG. 24 is a characteristic diagram of an equalizing target of the third embodiment of FIG. 23.

Therefore, the equalizing target characteristic of the third embodiment which is given by the product of G(f) of the equation (4) and the cosine roll-off characteristic R(f) of the Nyquist equalizer is the characteristic 122 of FIG. 24. In this figure, the characteristic 56 shown by the dotted line is the cosine roll-off characteristic R(f) of the Nyquist equalizer. In this figure, the convolution in the regenerating system of the third embodiment is in the case of k=3, s=2, and n=1 for the general type $(k-s\cdot D)\cdot(1+D)^n$.

Figure 25:
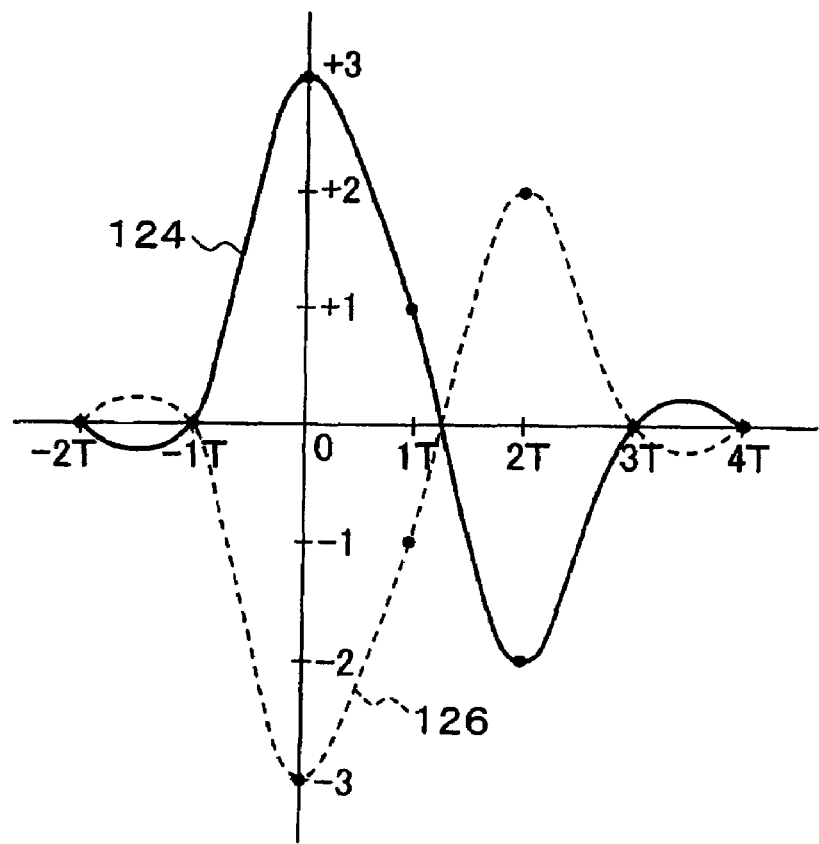
FIG. 25 is a schematic chart of an impulse response waveform represented by an equalizer output of FIG. 23.

The impulse response waveform 124 shown by FIG. 25 is obtained from output of the equalizer 118, which has the equalizing target characteristic as in FIG. 24. In this impulse response waveform 124, the partial response equalizing waveform, which is +3 at time 0, +1 at time +1T, −2 at time 2T, and 0 at other times ±nT (n is integer), is obtained. In this figure, the dotted line is the partial response equalizing waveform 126 corresponding to a negative impulse. Further, for convenience of description, the waveform without noises is shown, but actually it is the waveform with convoluted noises, and fluctuates around the value. The maximum-likelihood detecting circuit 120 of the third embodiment detects the convolution code according to Viterbi algorithm from the partial response equalizing waveform with convoluted noises. In the third embodiment, the convolution of (1−D) in the recording system and the convolution of $(3-2D)\cdot(1+D)^1$ in the regenerating system has been done, therefore, expansion to $$(1-D)\cdot(3-2D)\cdot(1+D)=3-2D-3D^2+2D^3$$

is possible. Therefore, convolution code "3, −2, −3, 2" corresponding to input code "1" is detected, and the output code is output.

Figure 26:
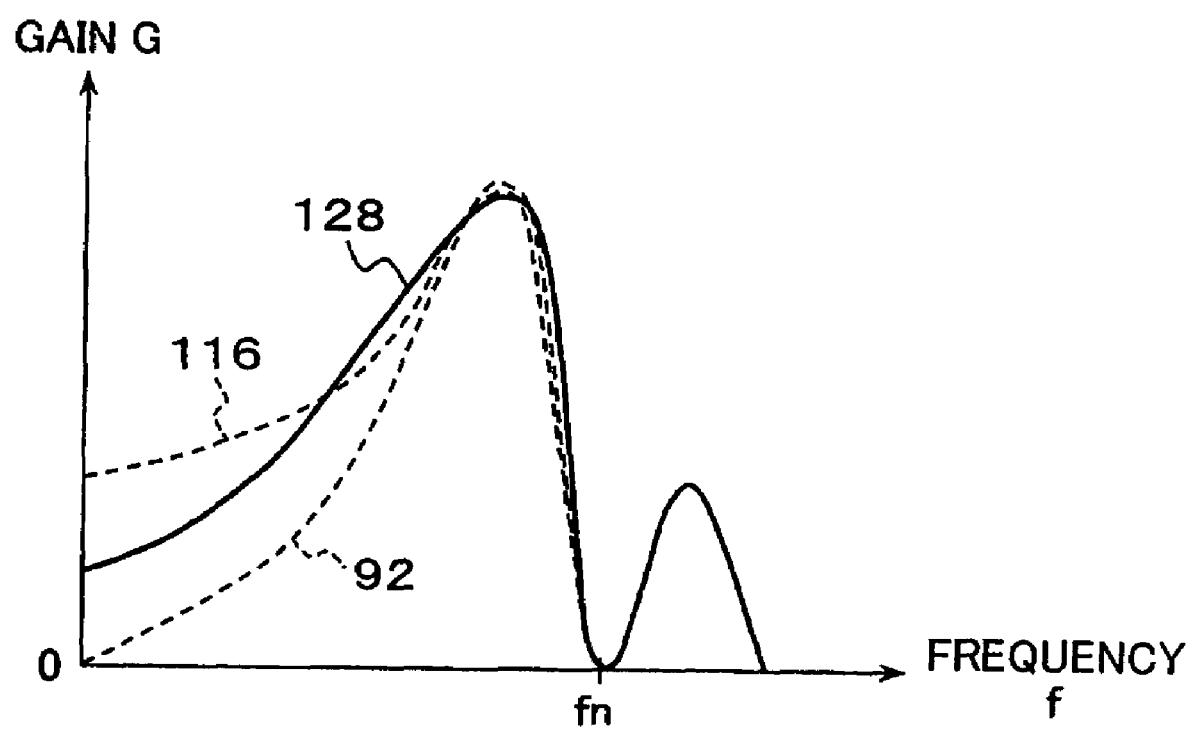
FIG. 26 is a transfer characteristic diagram of an equalizer of FIG. 23.

A block diagram in the case that the third embodiment, which has the basic structure of FIG. 23, is applied to the read channel 30 in the hard disk drive of FIG. 2 is same as the first embodiment of FIG. 9. More specifically, from the recording system to the sample circuit 80 of the regenerating system in FIG. 9 are basically same as the first embodiment. The transfer characteristic Q(f) of the next equalizer circuit 82 of the third embodiment, including the transfer characteristic of the low pass filter 78, is shown by characteristic 128 of FIG. 26, schematically. In this figure, characteristic 92 shown by a dotted line is the characteristic of the first embodiment of FIG. 11, and characteristic 116 shown by a dotted line is the characteristic of the second embodiment of FIG. 19. Therefore, characteristic 128 which gives the equalizer transfer characteristic Q(f) in the third embodiment is in the middle of the characteristic 92 in the first embodiment and the characteristic 116 in the second embodiment. In this point, the VFO circuit 88 used in the third embodiment of FIG. 9 may be achieved by prior art, by splitting the equalizer 82 into parts of a (1+D) filter and a (1−D) filter, and inputting the output of the (1+D) filter into the VFO circuit 88.

Figure 27:
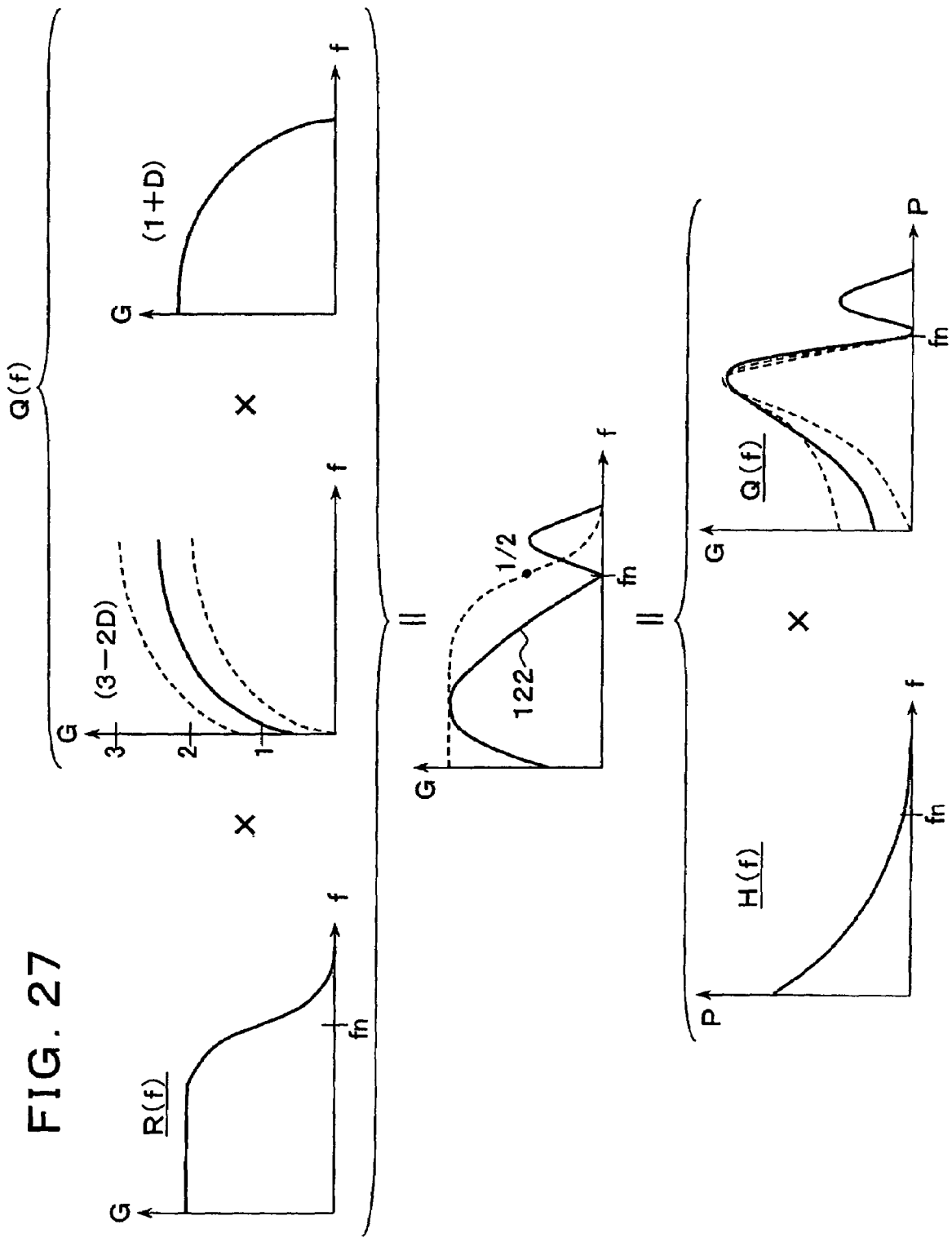
FIG. 27 is a schematic diagram representing relationship of H(f)·Q(f)=R(f)·G(f), which gives equalizing target characteristic of FIG. 24, by transfer characteristic diagrams.

FIG. 27 shows the relationship of the equation (1) which gives equalizing target characteristic 122 of FIG. 24 in the third embodiment, by each transfer characteristic diagram. In FIG. 27, G(f) corresponding to the convolution in the regenerating system is given by the product of (3−2D) and (1+D), and (3−2D) takes the values middle of (1−D) of the first embodiment and (2−D) of the second embodiment, which are shown by the dotted lines. Then, by calculating the product of G(f) and the cosine roll-off characteristic R(f) of the Nyquist equalizer, the equalizing target characteristic 122 of the third embodiment is obtained. Since the equalizing target characteristic 122 is equivalent to the product of the transfer characteristic H(f) and the equalizer transfer characteristic Q(f) in the recording system, by the equation (2) wherein divides the equalizing target characteristic 122 with the transfer characteristic H(f) in the recording system, the equalizer transfer characteristic Q(f) may be obtained.

Figure 28:
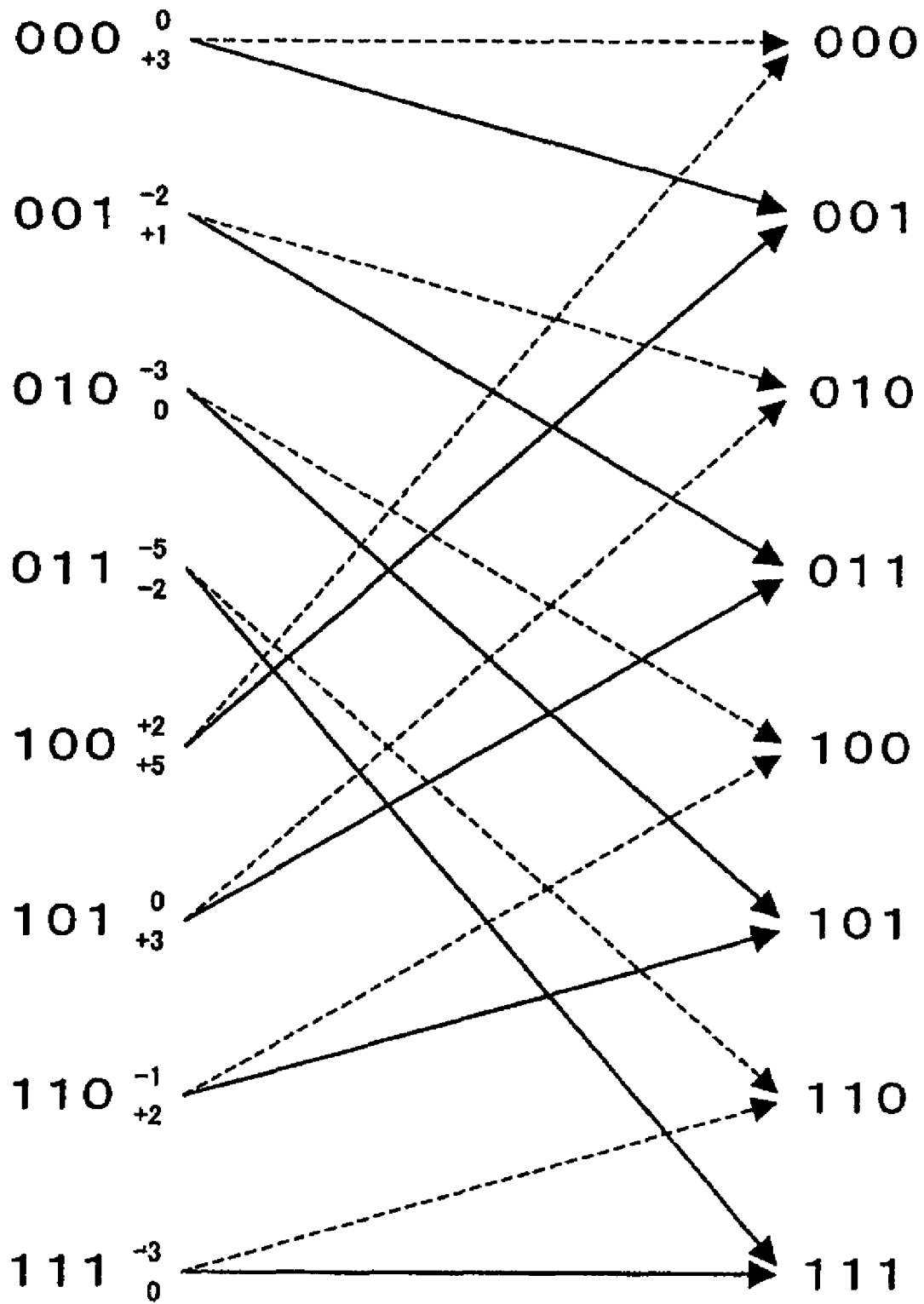
FIG. 28 is a trellis diagram used by a maximum-likelihood detecting circuit of FIG. 23.

The maximum-likelihood detecting circuit 84 of the third embodiment in FIG. 9, which has basically same structure as that of the first embodiment in FIG. 14, operates so that the convolution code "3, −2, −3, 2" is detected with Viterbi algorithm, in time sequence. FIG. 28 shows a trellis diagram showing possible combinations of the convolution code of the third embodiment. In this case, since one (1) bit is convoluted into four (4) bits, the constraint length=4. The detected code considered as one with maximum-likelihood in this way is processed in the post-coder 104 in FIG. 14 into the detected data, and finally, by 9/8 conversion in the decoder 86 of FIG. 9, into the decoded data.

Figure 29:
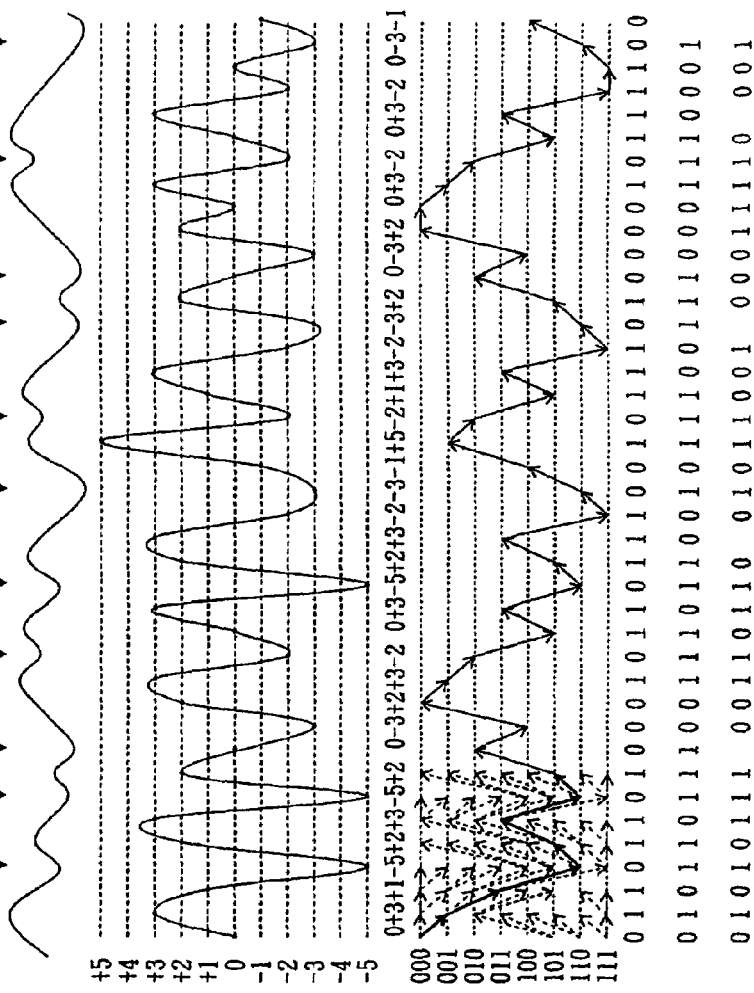
FIG. 29A to FIG. 29I are time charts of record regeneration by (1−D)·(3−2D)·(1+D)$^1$ PRML.

FIG. 29A to FIG. 29I are time charts which show details of recording and regenerating in the third embodiment. From the data to the head output of FIG. 29A to FIG. 29E are basically same as the first embodiment of FIG. 15A to FIG. 15E. The equalizer of FIG. 29E consists of, for example, 10 tap transversal FIR filters, and the sample point voltage takes nine (9) values "+5, +3, +2, +1, 0, −1, −2, −3, −5" because of the convolution code of "3, −2, −3, 2" overlapping each other, therefore, the partial response equalizing waveform which is Nyquist equalized shown in FIG. 29F is output. The maximum-likelihood detecting circuit of the third embodiment performs maximum-likelihood detection like FIG. 29 with Viterbi algorithm according to the trellis diagram in FIG. 28, and output the output code with maximum-likelihood shown by the solid line of FIG. 29H. On the other hand, the dotted line is the paths disappeared. Finally, 9/8 conversion is performed in the decoder, and the data of FIG. 29I is output. In this way, whether it is the first embodiment, the second embodiment or the third embodiment, by incorporating the convolution of (k−s·D) into the regenerating system in order to reduce the noises in the low-frequency band, the degree of freedom in the transfer characteristic of the equalizer is increased, and it is possible to make filter characteristic suitable to the noise characteristic of the medium and the like, therefore optimization of the regenerating system is achieved, and error rate may be improved.

Figure 30:
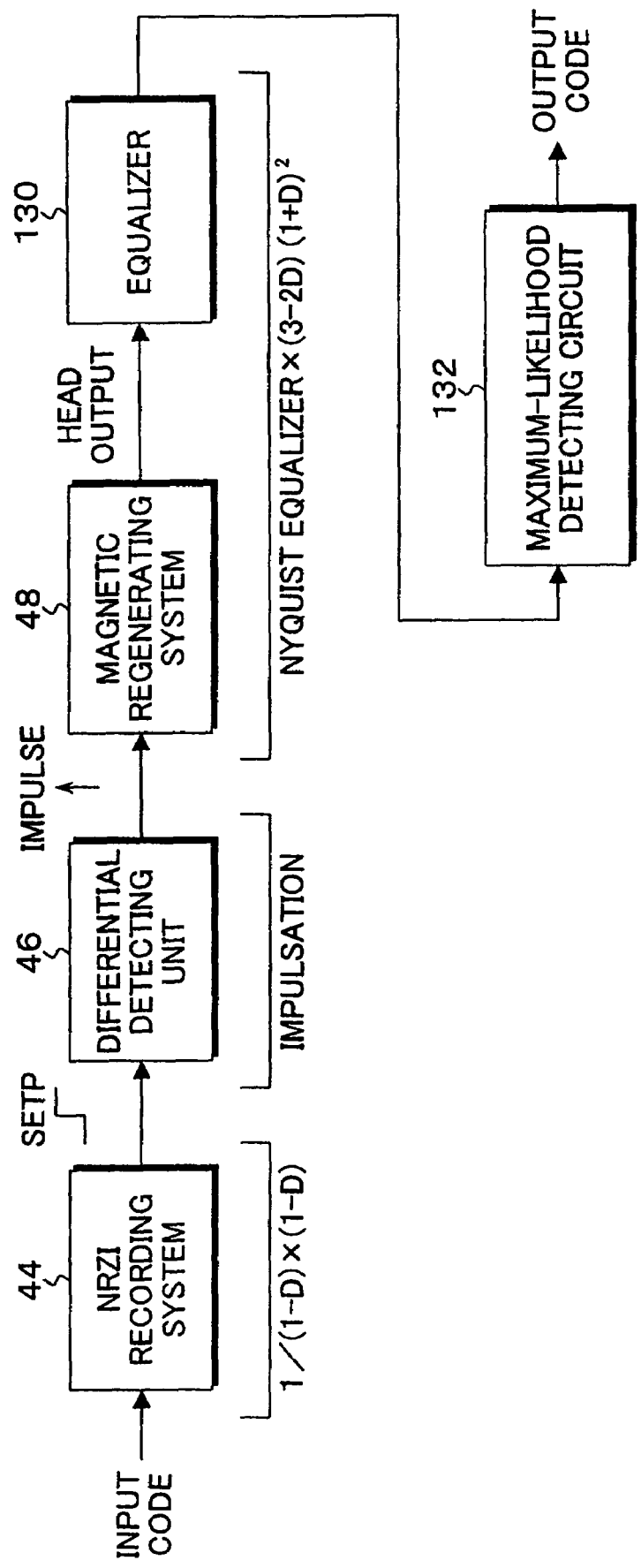
FIG. 30 is a block diagram of a fourth embodiment of the present invention covering a (1−D)·(3−2D)·(1+D)$^2$ PRML structure.

FIG. 30 is basic structure of a fourth embodiment, and the fourth embodiment is wherein $(1-D)\cdot(3-2D)\cdot(1+D)^2$ PRML structure is used, wherein, in addition to third embodiment, the convolution of (1+D) in the regenerating system is also performed.

In FIG. 30, from the NRZI recording system 44 to the magnetic regenerating system 48 are basically same as those of the first embodiment in FIG. 6. The transfer characteristic Q(f) of the next equalizer 130 is expressed by equation (2), wherein G(f) which is the convolution in the regenerating system is different. Specifically, G(f) of the fourth embodiment is given by $$G(f)=(3-2D)\cdot(1+D)^2 \qquad (5).$$

Figure 31:
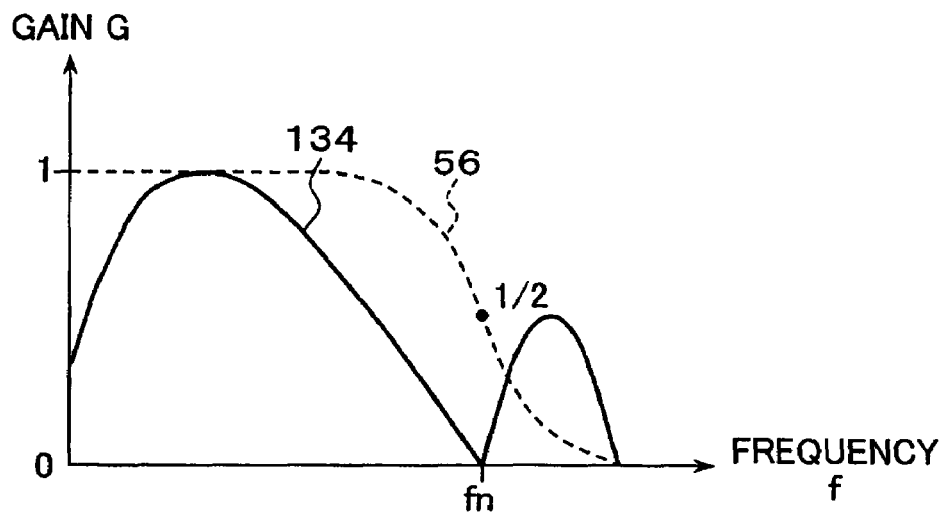
FIG. 31 is a characteristic diagram of an equalizing target of the fourth embodiment of FIG. 30.
Figure 32:
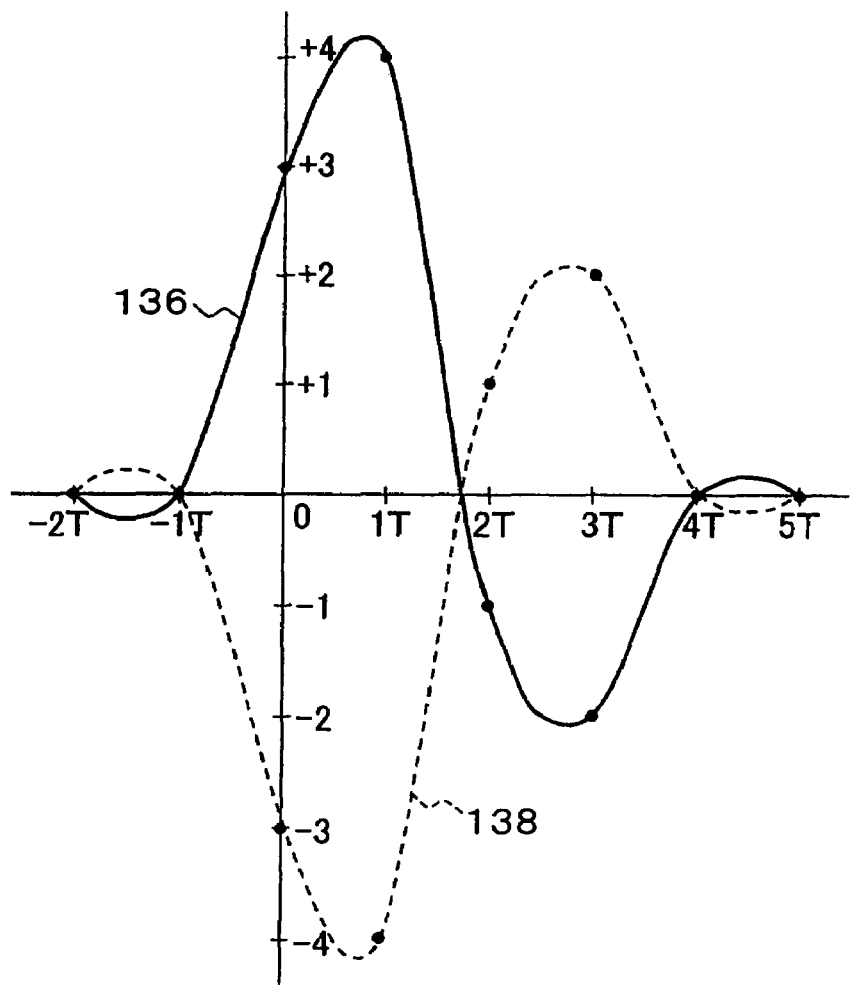
FIG. 32 is a schematic chart of an impulse response waveform represented by an equalizer output of FIG. 30.

Therefore, the equalizing target characteristic of the regenerating system which is given by the product of and the cosine roll-off characteristic R(f) of the Nyquist equalizer in the right side of the equation (1) and G(f) of the equation (5) is the characteristic 134 of FIG. 31. The characteristic 56 shown by the dotted line is the cosine roll-off characteristic R(f) of the Nyquist equalizer. From output of the equalizer 136, which achieves the equalizing target characteristic in the regenerating system like this, the impulse response waveform 134 shown by the solid line of FIG. 32 is obtained. This impulse response waveform 136 is the partial response equalizing waveform, which is +3 at time 0, +4 at time 1T, −1 at time 2T, −2 at time 3T, and 0 at other times ±nT (n is integer). In this figure, a waveform 138 shown by the dotted line is the partial response equalizing waveform corresponding to a negative impulse. Further, for convenience of description, the waveform without noises is shown, but actually it is the waveform with convoluted noises, and fluctuates around the value.

Figure 33:
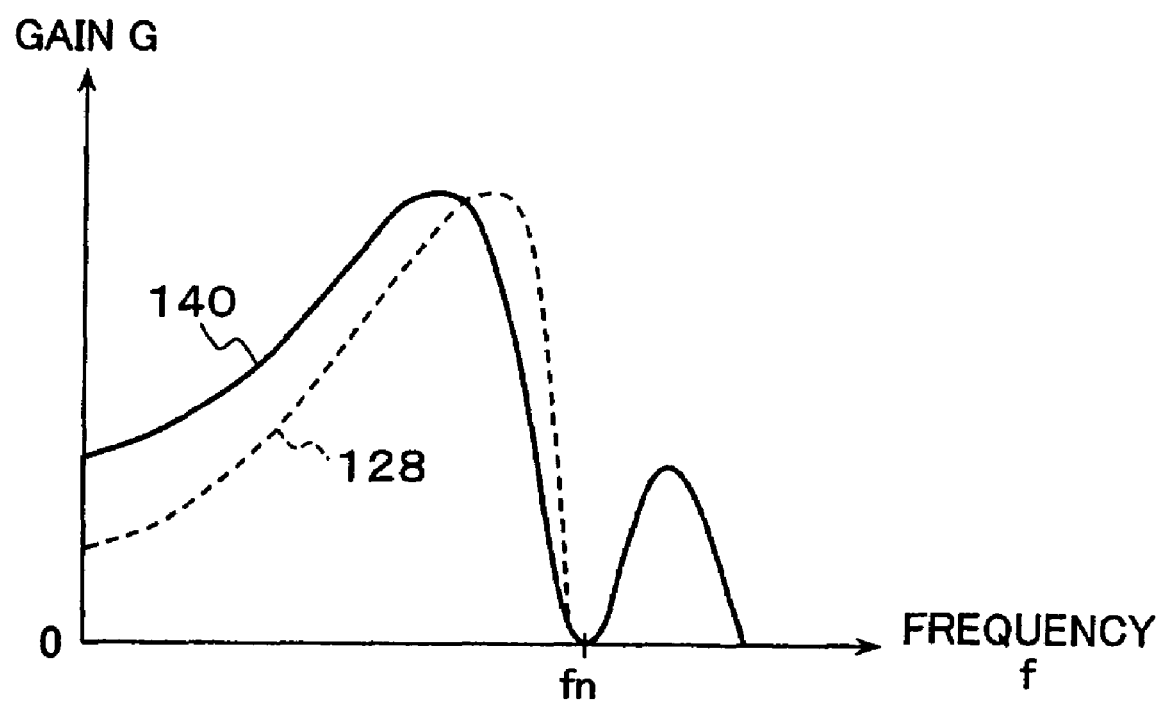
FIG. 33 is a transfer characteristic diagram of an equalizer of FIG. 30.

The maximum-likelihood detecting circuit 132 of the fourth embodiment detects the convolution code according to Viterbi algorithm from the partial response equalizing waveform with convoluted noises. In the fourth embodiment, the convolution of (1−D) in the recording system and the convolution of $(3-2D)\cdot(1+D)^2$ in the regenerating system has been done, therefore, expansion to $$(1-D)\cdot(3-2D)\cdot(1+D)^2=3+D-5D^2-D^3+2D^4$$

is possible. Therefore, convolution code "3, 1, −5, −1, 2" corresponding to the input code "1" is detected, and the output code is output. Now, specific structure in the case that the basic structure of the fourth embodiment of FIG. 30 is applied to the read channel 30 of the hard disk drive of FIG. 2 is described. A block diagram in the case that the fourth embodiment is applied to the read channel is same as the first embodiment of FIG. 9. More specifically, from the recording system to the sample circuit 80 of the regenerating system are basically same as the first embodiment, and the equalizer 82 and the maximum-likelihood detecting circuit 84 have structure unique to the fourth embodiment. The transfer characteristic Q(f) of the equalizer circuit 82 in the fourth embodiment, including the transfer characteristic of the low-pass filter 78 in the preceding stage, is shown by characteristic 140 of FIG. 33, schematically. In this figure, characteristic 128 shown by the dotted line is the characteristic 128 of the third embodiment in FIG. 26. Comparing to the equalizer transfer characteristic 128 of the third embodiment, it is understood that, in the characteristic 140 of the fourth embodiment, by adding the further convolution of (1−D) to the regenerating system, the gain in the high-frequency band is decreased, and the gain in the low-frequency band is increased simultaneously.

Figure 34:
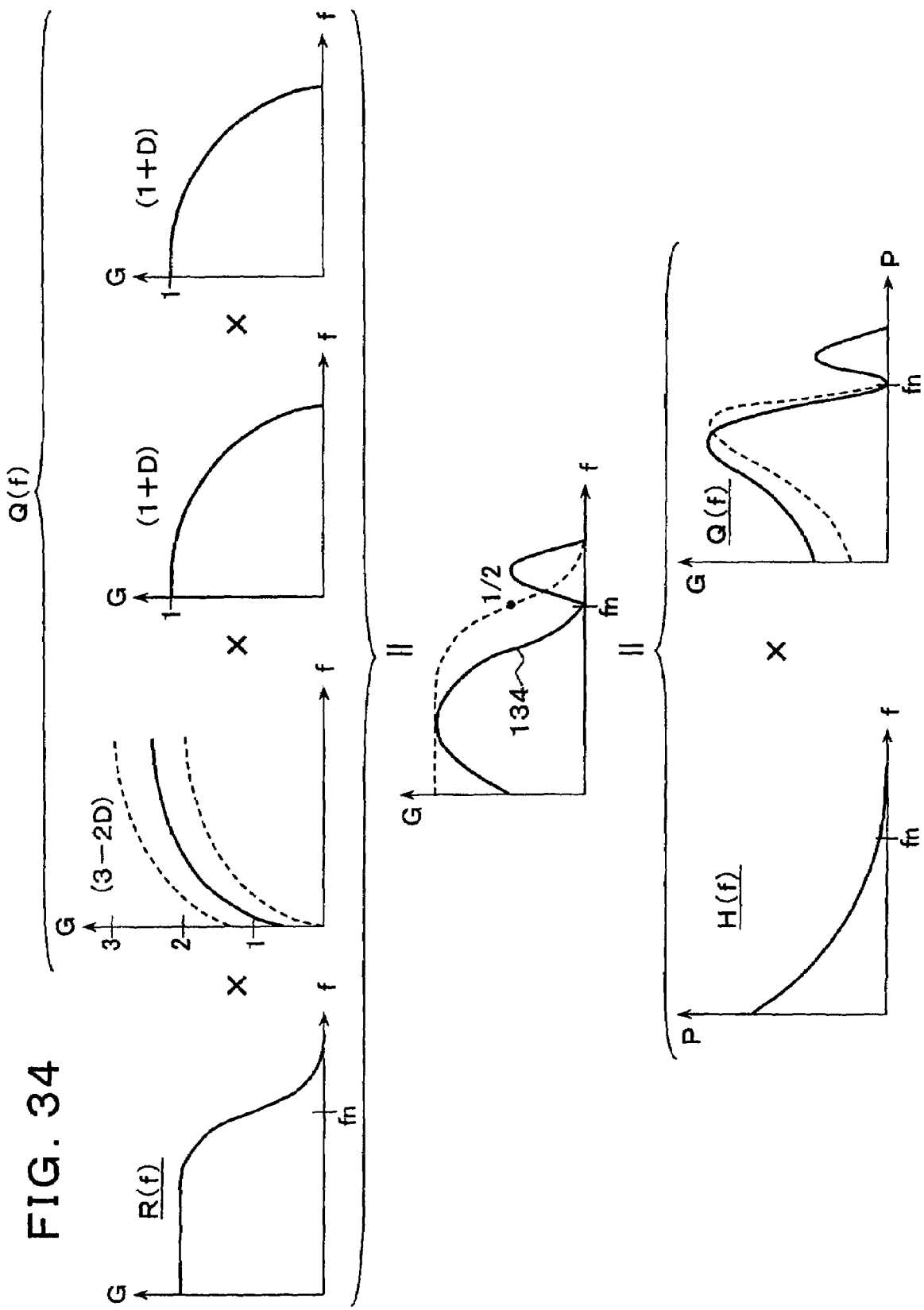
FIG. 34 is a schematic diagram representing relationship of H(f)·Q(f)=R(f)·G(f), which gives equalizing target characteristic of FIG. 31, by transfer characteristic diagrams.

FIG. 34 shows the relationship of the equation (1) which gives equalizing target characteristic of the regenerating system in the fourth embodiment, by transfer characteristic diagrams. From FIG. 34, It is obvious that, along with $(3-2D)\cdot(1+D)$ of the third embodiment, the convolution of (1+D) is also added to G(f) which gives the convolution in regenerating system, therefore, the gain in the high-frequency band is decreased, and the gain in the low-frequency band is increased. The product of G(f) in the regenerating system and the cosine roll-off characteristic R(f) of the Nyquist equalizer is the equalizing target characteristic 140 in the regenerating system shown in FIG. 33. In this condition, if the transfer characteristic H(f) in the magnetic regenerating system is known, the equalizing transfer characteristic Q(f) may be obtained from the equation (2), since the equalizing target characteristic 140 in regenerating system is equivalent to the product of the transfer characteristic H(f) in the magnetic regenerating system and the equalizing transfer characteristic Q(f). In this point, the VFO circuit 88 of the fourth embodiment in FIG. 9 may be achieved by prior art, by splitting the equalizer 82 into parts of a (1+D) filter and a (1−D) filter, and inputting the output of the (1+D) filter into the VFO circuit 88.

Figure 35:
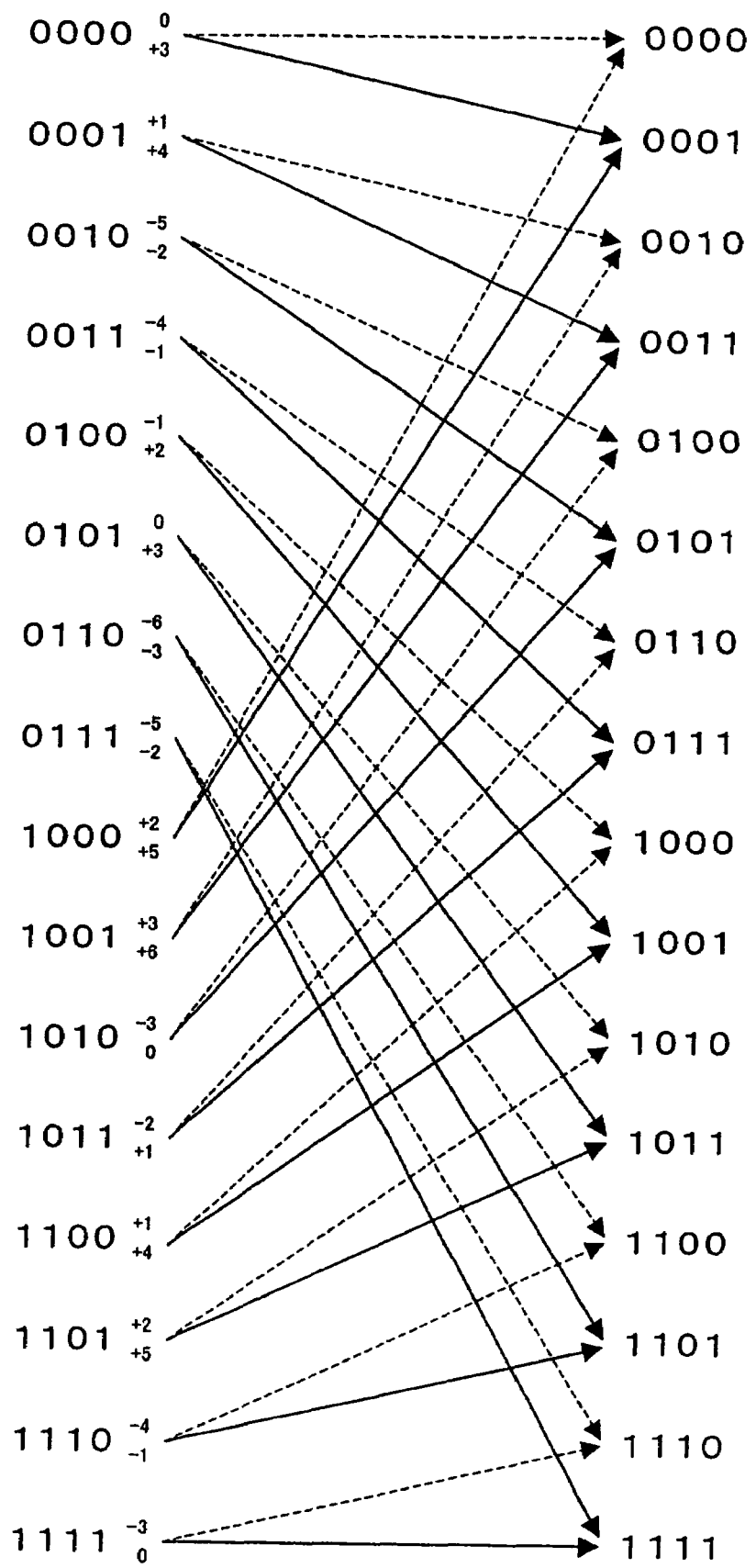
FIG. 35 is a trellis diagram used by a maximum-likelihood detecting circuit of FIG. 30.

Now, the maximum-likelihood detecting circuit 84 of the fourth embodiment is same as that of the first embodiment in principle, but since one (1) bit is convoluted into five (5) bits, the constraint length=5, and needed circuit amount is nearly twice as much as that of the first embodiment to the third embodiment, wherein the constraint length=4. Specifically, a square error detecting circuit 94 in the maximum-likelihood detecting circuit of FIG. 14 retains 16 node cumulative square errors corresponding to 16 nodes in the trellis diagram of FIG. 35. The cumulative square error calculating circuit 96 calculates new 32 branch cumulative square errors by adding 16 node cumulative square errors and 32 node cumulative square errors, respectively. The compare and select circuit 98 compares the branch cumulative square errors indicated by two arrows in the nodes of the right part of the trellis diagram of FIG. 35, considers that smaller data has higher likelihood, and outputs the data and select signals to a path memory 102.

Simultaneously, The compare and select circuit 98 outputs the branch cumulative square error corresponding to the selected data to the cumulative square error retaining circuit 100 as new node cumulative square error for that node. The path memory 102 consists of multi-stage registers recording the selected path, records the selected data from the compare and select circuit 98, and copies the data in each stage according to the select signal, as shown in the trellis diagram of FIG. 35. In this way, one half of paths continues to exist in each stage, and the other half disappears. By repeating this, only the path with maximum-likelihood will continues to exist on the path memory 102, and the maximum-likelihood detection will be done. In this way, the maximum-likelihood detecting circuit of the fourth embodiment operates so that the convolution code "3, 1, −5, −1, 2" is detected in time sequence. The detected data considered as one with maximum-likelihood is processed in a post-coder 104 into the detected data, and finally, converted by 9/8 conversion in the decoder 86 of the fourth embodiment of FIG. 9 to the decoded data.

FIG. 36A to FIG. 36I are time charts which show details of recording and regenerating in the fourth embodiment. The data of FIG. 36A to the head output of FIG. 36E are same as FIG. 15A to FIG. 15E in the first embodiment. The output waveform of the equalizer of FIG. 36F consists of, for example, 10 tap transversal FIRE filters, and the sample point voltage in this case is 11 values "+5, +4, +3, +2, +1, 0, −1, −2, −3, −4, −5" because of overlapping of the convolution code of "2, −1, −2, 1" offsetting each other, therefore, the partial response equalizing waveform which is Nyquist equalized is output as shown. The maximum-likelihood detecting circuit of FIG. 36G performs maximum-likelihood detection with Viterbi algorithm according to the trellis diagram shown in FIG. 35, and the paths shown by the solid lines will be continued to exist, then the output code of FIG. 36H is output. Finally, by performing 9/8 conversion of the output code, the data of FIG. 36I is decoded.

In the embodiments, for $(k-s \cdot D) \cdot (1+D)^n$ which is the general type of the convolution in the regenerating system, in the cases of k=1, s=1, n=1, which is the first embodiment, k=1, s=2, n=1, which is the second embodiment, k=3, s=2, n=1, which is the third embodiment and k=3, s=2, n=2, which is the fourth embodiment, are used as examples, but the present invention is not limited to these, and it is possible to set any filter characteristics suitable to medium noises and the like by optimizing K, S and n to the transfer characteristic H(f) in the magnetic regenerating system determined by the frequency characteristics of the medium and the head.

Also, in the embodiments, though the case of being provided with NRZI circuit which performs the convolution of (1−D) in the recording system is used as example, other recording system which does not include the convolution of (1−D) may be also applicable.

Further, in the embodiments, if a direct current element results in problems, it may be possible to provide a scrambling circuit before the encoder to randomize the data, and when regenerating, to provide a descrambling circuit after the decoder to restore the data.

Further, in the embodiments, though VFO circuit receives input from filter output, the structure which receives input from equalizer output may be used.

Further, in the embodiments, though the cases that the maximum-likelihood circuit takes square error is described, the structure multiplying the constant number including 1 may be used.

Further, the regenerating system after the sample circuit may consist of analog circuits, or digital circuit with quantization.

Further, though the write head and the read head are described as separate heads, these may be identical head.

Further, though 8/9 RLL code is used as example of RLL code, other codes such as 16/17 RLL code may be applicable.

Further, the present invention includes any appropriate variants insofar as they do not impair objects and advantages of the invention. The present invention is not limited by the numerical values denoted in the embodiments.

INDUSTRIAL APPLICABILITY

As set forth hereinabove, according to the present invention, by including at least the convolution of $(k-s \cdot D)$ in the regenerating system, noises with peaks of power in low-frequency band, such as medium noises, may be reduced effectively, and with this reduction of noises in low-frequency band, it may be possible to increase recording density, improve regenerating error rate, and also improve regenerating error rate with reduction of sidestrokes.

Further, by optimizing integer k and s in the convolution of $(k-s \cdot D)$, the degree of freedom in the transfer characteristic of the equalizer is increased, and it is possible to easily achieve filter characteristic suitable to the noise characteristic of the medium and the like, and by this optimization of integer k and s, it is possible to effectively reduce noises in low-frequency band, and increase recording density. Especially, though, since an area of one (1) bit will be closing in on that of particles of magnetic materials in the future, the medium noises would be increased, the noises in low-frequency band can be effectively reduced, and significant contribution to the improvement of recording density can be achieved, by including the convolution of $(k-s \cdot D)$ in the regenerating system of the present invention.

The invention claimed is:

1. A signal processing method utilizing a partial response to record information on a medium and then regenerate the information from the medium, wherein a record signal recorded on the medium is subjected to the convolution of (1−D) in an NRZI recording process, where D: one (1) bit delay operator, wherein a regeneration signal from the medium is subjected to an equalizing process including the convolution of $$(k-s \cdot D)(1+D)^n$$

where D: one (1) bit delay operator, k, s: integer, n: positive integer, and k=1, s=1, n=1, and wherein the information is decoded from the equalized signal by use of maximum-likelihood detection, and the maximum-likelihood detection convolution code of $$(1-D)k-s \cdot D)(1+D)^n$$

where

D: one (1) bit delay operator, k, s: integer, n: positive integer, and k=1, s=1, n=1.

2. A signal processing circuit utilizing a partial response to record information on a medium through a recording system and regenerate the information from the medium through a regenerating system, wherein
the recording system includes a circuit unit subjecting a record signal recorded on the medium to the convolution of
(1−D) in an NRZI recording circuit,
where D: one (1) bit delay operator, wherein
the regeneration system includes an equalizer subjecting an output signal from the medium to the convolution of $(k-s \cdot D)(1+D)^n$ where D: one (1) bit delay operator,
k, s: integer,
n: positive integer, and
k=1, s=1, n=1 and
wherein the detecting circuit comprises a maximum-likelihood detector which decodes the information from an output signal of the equalizer by use of maximum-likelihood detection, and the maximum-likelihood detection convolution code of $(1-D)(k-s \cdot D)(1+D)^n$ where
D: one (1) bit delay operator,
k, s: integer,
n: positive integer, and
k=1, s=1, n=1.

3. A signal recording/regenerating apparatus utilizing a partial response to record information on a medium through a recording system and regenerate the information from the medium through a regenerating system, wherein
the record system includes a circuit unit subjecting a record signal recorded on the medium to convolution of
(1−D) in an NRZI recording circuit,
where D: one (1) bit delay operator, wherein
the regeneration system includes an equalizer subjecting a regeneration signal from the medium to the convolution of $(k-s \cdot D)(1+D)^n$ where D: one (1) bit delay operator,
k, s: integer,
n: positive integer, and
k=1, s=1, n=1 and
wherein the detecting circuit comprises a maximum-likelihood detector which decodes the information from an output signal of the equalizer by use of maximum-likelihood detection, and the maximum-likelihood detection convolution code of $(1-D)(k-s \cdot D)(1+D)^n$ where
D: one (1) bit delay operator,
k, s: integer,
n: positive integer, and
k=1, s=1, n=1.

* * * * *

UNITED STATES PATENT AND TRADEMARK OFFICE
CERTIFICATE OF CORRECTION

PATENT NO. : 7,535,812 B2
APPLICATION NO. : 12/075376
DATED : May 19, 2009
INVENTOR(S) : Hiroshi Uno Page 1 of 1

It is certified that error appears in the above-identified patent and that said Letters Patent is hereby corrected as shown below:

Col. 16, line 62, delete "$(1-D)k-s \cdot D)(1+D)^n$" and insert --$(1-D)(k-s \cdot D)(1+D)^n$-- therefore.

Signed and Sealed this

Tenth Day of November, 2009

David J. Kappos
*Director of the United States Patent and Trademark Office*